(12) United States Patent
Chen et al.

(10) Patent No.: US 11,595,042 B1
(45) Date of Patent: Feb. 28, 2023

(54) INPUT/OUTPUT (I/O) CIRCUIT WITH DYNAMIC FULL-GATE BOOSTING OF PULL-UP AND PULL-DOWN TRANSISTORS

(71) Applicant: QUALCOMM Incorporated, San Diego, CA (US)

(72) Inventors: Wilson Jianbo Chen, San Diego, CA (US); Chiew-Guan (Kelvin) Tan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/526,805

(22) Filed: Nov. 15, 2021

(51) Int. Cl.
*H03K 3/00* (2006.01)
*H03K 17/10* (2006.01)
*H03K 17/66* (2006.01)
*H03K 17/687* (2006.01)
*H04B 1/40* (2015.01)

(52) U.S. Cl.
CPC ..... *H03K 17/6872* (2013.01); *H03K 17/6874* (2013.01); *H04B 1/40* (2013.01)

(58) Field of Classification Search
None
See application file for complete search history.

(56) References Cited

U.S. PATENT DOCUMENTS

| | | | |
|---|---|---|---|
| 7,227,400 B1 * | 6/2007 | Gillespie | H03K 19/00315 327/333 |
| 8,754,677 B2 * | 6/2014 | Chen | G05F 1/565 327/112 |
| 8,779,739 B2 * | 7/2014 | Huang | H02M 3/1588 327/108 |

\* cited by examiner

*Primary Examiner* — Kenneth B Wells
(74) *Attorney, Agent, or Firm* — Loza & Loza, LLP

(57) ABSTRACT

An aspect of the disclosure relates to an apparatus including an output driver, including: a first p-channel metal oxide semiconductor field effect transistor (PMOS FET); a second PMOS FET coupled in series with the first PMOS FET between an upper voltage rail and an output; a first n-channel metal oxide semiconductor field effect transistor (NMOS FET); and a second NMOS FET coupled in series with the first NMOS FET between the output and a lower voltage rail; a first predriver coupled to gates of the first and second PMOS FETs and first and second NMOS FETs; and a second predriver coupled to the gates of the first and second PMOS FETs and first and second NMOS FETs.

30 Claims, 10 Drawing Sheets

INPUT/OUTPUT (I/O) CIRCUIT WITH DYNAMIC FULL-GATE BOOSTING OF PULL-UP AND PULL-DOWN TRANSISTORS

FIELD

Aspects of the present disclosure relate generally to input/output (I/O) drivers, and in particular, to an I/O circuit with dynamic full-gate boosting of pull-up and pull-down transistors.

BACKGROUND

An input/output (I/O) circuit is typically employed to convert an input signal in a first voltage domain to generate an output signal in a second voltage domain. A voltage domain is defined by the voltage levels of the high and low logic voltage levels or states of the signal. The input/output (I/O) circuit may have received the input signal from circuitry configured to process signals in the first voltage domain. The input/output (I/O) circuit may provide the output signal to circuitry configured to process signals in the second voltage domain. The voltage level shifting may be upwards where the second voltage domain has at least one logic voltage level higher than at least one corresponding logic voltage level of the first voltage domain.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes an output driver, including: a first p-channel metal oxide semiconductor field effect transistor (PMOS FET); a second PMOS FET coupled in series with the first PMOS FET between a first voltage rail and an output; a first n-channel metal oxide semiconductor field effect transistor (NMOS FET); and a second NMOS FET coupled in series with the first NMOS FET between the output and a second voltage rail; a first predriver coupled to gates of the first and second PMOS FETs and first and second NMOS FETs; and a second predriver coupled to the gates of the first and second PMOS FETs and first and second NMOS FETs.

Another aspect of the disclosure relates to a method. The method includes applying a first control signal to a gate of a first p-channel metal oxide semiconductor field effect transistor (PMOS FET); applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a high logic state, and wherein the first and second control signals are at a first set of boosted voltages when the output signal is transitioning from the low logic state to the high logic state, respectively; applying a third control signal to a gate of a first n-channel metal oxide semiconductor field effect transistor (NMOS FET); and applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively.

Another aspect of the disclosure relates to an apparatus. The apparatus includes means for applying a first control signal to a gate of a first p-channel metal oxide semiconductor field effect transistor (PMOS FET); means for applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a high logic state, and wherein the first and second control signals are at a first set of boosted voltages when the output signal is transitioning from the low logic state to the high logic state, respectively; means for applying a third control signal to a gate of a first n-channel metal oxide semiconductor field effect transistor (NMOS FET); and means for applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively.

Another aspect of the disclosure relates to a wireless communication device. The wireless communication device includes at least one antenna; a transceiver coupled to the at least one antenna; and an integrated circuit (IC) coupled to the transceiver, wherein the IC includes at least one of the one or more I/O circuits including: an output driver, including: a first p-channel metal oxide semiconductor field effect transistor (PMOS FET); a second PMOS FET coupled in series with the first PMOS FET between an upper voltage rail and an output; a first n-channel metal oxide semiconductor field effect transistor (NMOS FET); and a second NMOS FET coupled in series with the first NMOS FET between the output and a lower voltage rail; a first predriver coupled to gates of the first and second PMOS FETs and first and second NMOS FETs; and a second predriver coupled to the gates of the first and second PMOS FETs and first and second NMOS FETs.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
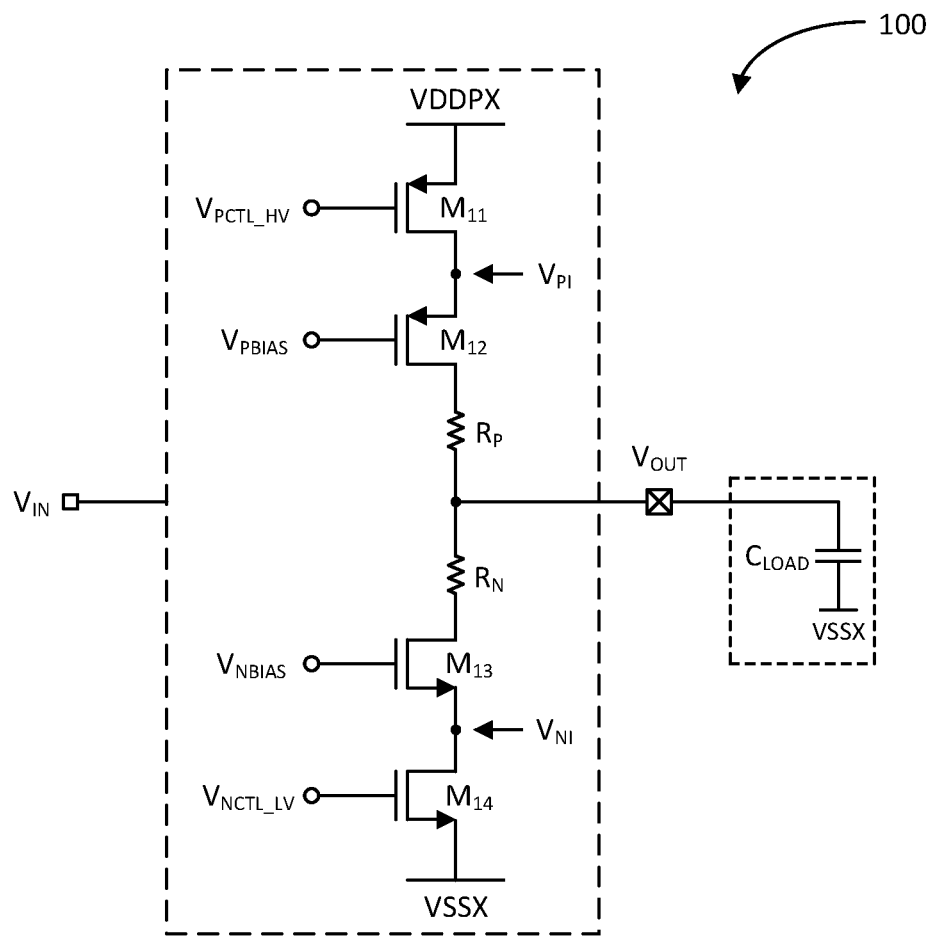
FIG. 1A illustrates a schematic diagram of an example input/output (I/O) driver in accordance with an aspect of the disclosure.

FIG. 1A illustrates a schematic diagram of an example input/output (I/O) driver 100 in accordance with an aspect of the disclosure. The I/O driver 100 is configured to receive an input signal $V_{IN}$ from, for example, a core circuit of an integrated circuit (IC) or system on chip (SOC). The input signal $V_{IN}$ may swing between a high logic voltage (e.g., 1.1V) and a low logic voltage (e.g., 0.5V) according to a first or core voltage domain.

In response to the high and low logic voltages of the input signal $V_{IN}$, the I/O driver 100 generates an output signal $V_{OUT}$ at an output (e.g., an I/O pad, represented as an X inside a square) that swings between a high logic voltage (e.g., 1.8V) and a low logic voltage (e.g., 0V) according to a second or PX voltage domain, respectively. As discussed in more detail below, the high and low logic voltages of the PX voltage domain may swing substantially between supply voltage VDDPX (applied to a first voltage rail) and supply voltage VSSX (applied to a second voltage rail). The I/O driver 100 provides the output signal $V_{OUT}$ to a load coupled between the output and the second voltage rail VSSX. The load may have a capacitance $C_{LOAD}$. As used herein, a voltage rail and the supply voltage provided to the voltage rail may be referred to by the same label for ease of description. Similarly, a node and a voltage at the node may be referred to by the same label for ease of description.

In this example, the I/O driver 100 includes a pull-up circuit situated between the first voltage rail VDDPX and the output $V_{OUT}$. The pull-up circuit is configured to couple the first voltage rail VDDPX to the output $V_{OUT}$ to cause the output signal $V_{OUT}$ to transition to and settle at a high logic voltage, such as substantially the supply voltage VDDPX at the first rail voltage (e.g., 1.8V). The pull-up circuit is also configured to isolate or decouple the first voltage rail VDDPX from the output $V_{OUT}$ to allow the output signal $V_{OUT}$ to transition to and settle at a low logic voltage, such as substantially VSSX at the second rail voltage (e.g., 0V or ground). In this example, the pull-up circuit includes a pair of p-channel metal oxide semiconductor (PMOS) field effect transistors (FETs) (hereinafter "PMOS FETs") $M_{11}$ and $M_{12}$, and a resistor $R_P$. The PMOS FET $M_{11}$ is responsive to a control signal $V_{PCTL\_HV}$ for turning on and off the PMOS FET $M_{11}$ in order to couple and isolate the output $V_{OUT}$ to and from the first rail voltage VDDPX, respectively.

The PMOS FET $M_{12}$ of the pull-up circuit may be biased with a substantially constant gate voltage $V_{PBIAS}$, which may be set to VDDPX/2 (e.g., 0.9V). Configured as such, the PMOS FET $M_{12}$ turns on and off responsive to the turning on and off of the PMOS FET $M_{11}$, respectively. For instance, when the control signal $V_{PCTL\_HV}$ is substantially at a low logic voltage, such as VDDPX/2 (e.g., 0.9V), the PMOS FET $M_{11}$ turns on because its gate-to-source voltage ($V_{GS}$) (e.g., 1.8V−0.9V=0.9V) is greater than its threshold voltage $V_T$ (e.g., 0.4V). The turning on of the PMOS FET $M_{11}$ causes substantially VDDPX to be applied to the source of the PMOS FET $M_{12}$. Accordingly, the PMOS FET $M_{12}$ turns on because its $V_{GS}$ (e.g., 1.8V−0.9V=0.9V) is greater than its threshold voltage $V_T$ (e.g., 0.4V). Both PMOS FETs $M_{11}$ and $M_{12}$ being turned on causes VDDPX to be applied substantially to the output $V_{OUT}$ of the I/O driver 100 by way of resistor $R_P$, which causes the output signal $V_{OUT}$ to transition to and settle substantially at VDDPX (e.g., ~1.8V). The resistor $R_P$ limits the current flow through the PMOS FETs $M_{11}$ and $M_{12}$ to prevent overstressing or damaging of these devices.

Similarly, when the control signal $V_{PCTL\_HV}$ is at a high logic voltage, such as substantially at VDDPX (e.g., 1.8V), the PMOS FET $M_{11}$ turns off because its $V_{GS}$ (e.g., 1.8V−1.8V=0V) is less than its threshold voltage $V_T$ (e.g., 0.4V). The PMOS FET $M_{11}$ being turned off isolates VDDPX from the source of PMOS FET $M_{12}$, which causes the voltage at the source of PMOS FET $M_{12}$ to decrease and settle at a voltage $V_{PI}$ less than a threshold voltage above $V_{PBIAS}$ (e.g., <1.3V). Thus, the PMOS FET $M_{12}$ turns off because its $V_{GS}$ does not exceed its threshold voltage $V_T$. With both PMOS FETS $M_{11}$ and $M_{12}$ turned off, the output $V_{OUT}$ is substantially isolated from VDDPX, allowing a pull-down circuit of the I/O driver 100 to pull-down the output signal $V_{OUT}$ so that it transitions to and settles at substantially VSSX (e.g., 0V).

When the output signal $V_{OUT}$ is substantially at VSSX, the PMOS FET $M_{12}$ prevents the entire voltage difference between VDDPX and VSSX from being applied across PMOS FET $M_{11}$, thereby preventing overstressing of or damage to device $M_{11}$. Instead, the voltage difference (VDDPX–VSSX) is split, maybe albeit unequally, across both PMOS FETs $M_{11}$ and $M_{12}$. Thus, the PMOS FET $M_{12}$ acts as a buffering device for PMOS FET $M_{11}$.

The I/O driver 100 further includes a pull-down circuit situated between the output $V_{OUT}$ and the second voltage rail VSSX. The pull-down circuit is configured to couple the output $V_{OUT}$ to the second voltage rail VSSX to cause the output signal $V_{OUT}$ to transition to and settle at a low logic voltage, such as substantially the steady-state second rail voltage VSSX (e.g., 0V or ground). The pull-down circuit is also configured to isolate or decouple the output $V_{OUT}$ from the second voltage rail VSSX to allow the output signal $V_{OUT}$ to transition to and settle at a high logic voltage, such as substantially the first rail voltage VDDPX. In this example, the pull-down circuit includes a pair of n-channel MOS FETs (hereinafter "NMOS FETs") $M_{13}$ and $M_{14}$, and resistor $R_N$. The NMOS $M_{14}$ is responsive to a control signal $V_{NCTL\_LV}$ for turning on and off the NMOS FET $M_{14}$ in order to couple and isolate the output $V_{OUT}$ to and from the second voltage rail VSSX, respectively.

The NMOS FET $M_{13}$ of the pull-down circuit may be biased with a substantially constant gate voltage $V_{NBIAS}$, which may be set to VDDPX/2 (e.g., 0.9V). Configured as such, the NMOS FET $M_{13}$ turns on and off responsive to the turning on and off of NMOS FET $M_{14}$, respectively. For instance, when the control signal $V_{NCTL\_LV}$ is at a high logic voltage, such as VDDPX/2 (e.g., 0.9V), the NMOS FET $M_{14}$ is turned on because its $V_{GS}$ (e.g., 0.9V-0V=0.9V) is greater than its threshold voltage $V_T$ (e.g., 0.4V). The turning on of NMOS FET $M_{14}$ causes VSSX to be substantially applied to the source of NMOS FET $M_{13}$. In response, NMOS FET $M_{11}$ turns on because its $V_{GS}$ (e.g., 0.9V-0V=0.9V) is greater than its threshold voltage $V_T$ (e.g., 0.4V). Both NMOS FETs $M_{13}$ and $M_{14}$ being turned on causes VSSX to be applied substantially to the output $V_{OUT}$ by way of resistor $R_N$, which results in the output signal $V_{OUT}$ to transition to and settle substantially at the second rail voltage VSSX (e.g., 0V). The resistor $R_N$ limits the current flow through the devices $M_{11}$ and $M_{14}$ to prevent overstressing of or damage to the devices.

Similarly, when control signal $V_{NCTL\_LV}$ is at a low logic voltage, such as VSSX (e.g., 0V), the NMOS FET $M_4$ is turned off because its $V_{GS}$ (e.g., 0V-0V=0V) is less than its threshold voltage $V_T$ (e.g., 0.4V). The device NMOS FET $M_{14}$ being turned off isolates VSSX from the source of NMOS FET $M_{13}$, which causes the source of NMOS FET $M_3$ to decrease and settle to less than a threshold voltage below $V_{NBIAS}$ (e.g., >0.7V). Accordingly, NMOS FET $M_{13}$ is turned off because its $V_{GS}$ does not exceed its threshold voltage $V_T$. Both NMOS FETs $M_{13}$ and $M_{14}$ being turned off decouple the output $V_{OUT}$ from the second voltage rail VSSX; thereby allowing the pull-up circuit to cause the output signal $V_{OUT}$ to transition to and settle at the high logic voltage, such as substantially at the first rail voltage VDDPX (e.g., 1.8V).

When the output signal $V_{OUT}$ is at VDDPX, the NMOS FET $M_{13}$ prevents the entire voltage difference between VDDPX and VSSX from being applied across NMOS FET $M_{14}$, thereby preventing overstressing of or damage to device $M_{14}$. Instead, the voltage difference (VDDPX–VSSX) is split, maybe albeit unequally, across both NMOS FETs $M_{13}$ and $M_{14}$. Thus, NMOS FET $M_{13}$ acts as a buffering device for NMOS FET $M_{14}$.

Note that the respective logic voltages pertaining to the output signal $V_{OUT}$, the control signal $V_{PCTL\_HV}$, and the control signal $V_{NCTL\_HV}$ are in different voltage domains. For instance, the high and low logic voltages pertaining to the $V_{OUT}$ voltage domain vary between substantially VDDPX (e.g., 1.8V) and VSSX (e.g., 0V) (which may be referred to herein as the PX voltage domain). The high and low logic voltages pertaining to the $V_{PCTL\_HV}$ voltage domain vary between substantially VDDPX (e.g., 1.8V) and VSSIX (e.g., 0.9V) (which may be referred to herein as the HV voltage domain). And, the high and low logic voltages pertaining to the $V_{NCTL\_LV}$ voltage domain vary between substantially VDDIX (e.g., 0.9V) and VSSX (e.g., 0V) (which may be referred to herein as the LV voltage domain).

Figure 1B:
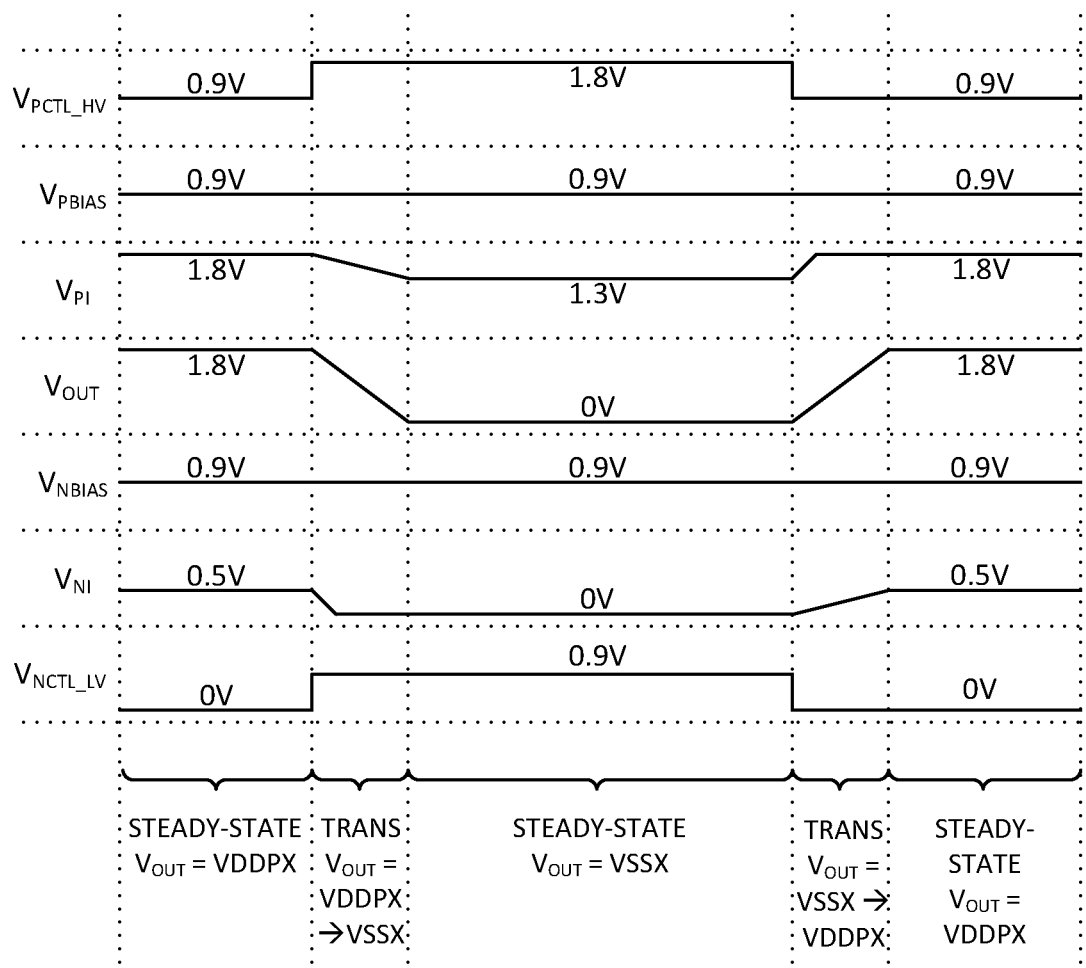
FIG. 1B illustrates a timing diagram of example signals relevant to the operation of the I/O driver of FIG. 1A in accordance with another aspect of the disclosure.

FIG. 1B illustrates a timing diagram of example signals relevant to the operation of the example I/O driver 100 in accordance with another aspect of the disclosure. The horizontal axis of the timing diagram represents time, and is divided into four states or time intervals: (1) when the output signal $V_{OUT}$ is at a steady-state high logic voltage VDDPX, which is indicated in the left-most and right-most columns of the timing diagram; (2) when the output signal $V_{OUT}$ is transitioning from the high logic voltage VDDPX to a low logic voltage VSSX, which is indicated in the second column from the left; (3) when the output signal $V_{OUT}$ is at a steady-state low logic voltage VSSX, which is indicated in the third column from the left; and (4) when the output signal $V_{OUT}$ is transitioning from the low logic voltage VSSX to the high logic voltage VDDPX, which is indicated in the fourth column from the left.

The vertical axis of the timing diagram represents the various signals of the I/O driver 100. For instance, from top to bottom, the signals are: (1) the control signal $V_{PCTL\_HV}$ for PMOS FET $M_{11}$; (2) the gate bias voltage $V_{BIAS}$ for PMOS FET $M_{12}$; (3) the voltage $V_{PI}$ at the source of PMOS FET $M_{12}$; (4) the output signal $V_{OUT}$ of the I/O driver 100; (5) the gate bias voltage $V_{NBIAS}$ for NMOS FET $M_{13}$; (6) the voltage $V_{NI}$ at the source of NMOS FET $M_{13}$; and (7) the control signal $V_{NCTL\_LV}$ for NMOS FET $M_{14}$.

In operation, during the state or time interval where the output signal $V_{OUT}$ is at a steady-state high logic voltage VDDPX as indicated in the left-most column of the timing diagram, the control signal $V_{PCTL\_HV}$ is at a low logic voltage VSSIX (e.g., 0.9V) and the gate bias voltage $V_{PBIAS}$ is at a constant VDDPX/2 voltage (e.g., 0.9V) in order to turn on both PMOS FETs $M_{11}$ and $M_{12}$, respectively. The turning on of both PMOS FETs $M_{11}$ and $M_{12}$ results in substantially applying VDDPX to the output $V_{OUT}$, thereby maintaining the output signal $V_{OUT}$ steady at the high logic voltage VDDPX (e.g., 1.8V). Also, the voltage $V_{PI}$ at the source of PMOS FET $M_{12}$ is substantially at VDDPX (e.g., 1.8V). Further, during this state or time interval, the control signal $V_{NCTL\_LV}$ is at a low logic voltage VSSX (e.g., 0V) to turn off NMOS FET $M_{14}$. The gate bias voltage $V_{NBIAS}$ for NMOS FET $M_{13}$ is at the constant VDDPX/2 voltage (e.g., 0.9V). With NMOS FET $M_{14}$ being turned off, the voltage $V_{NI}$ at the source of NMOS FET $M_{13}$ settles to less than a threshold voltage below $V_{NBIAS}$, for example, to >$V_{NBIAS}$-

$V_T$ (e.g., >0.5V). Thus, both NMOS FETs $M_{13}$ and $M_{14}$ are turned off to isolate or decouple the output $V_{OUT}$ from VSSX.

During the state or time interval where the output signal $V_{OUT}$ is transitioning from the high logic voltage VDDPX to the low logic voltage VSSX as indicated in the second column from the left, the control signal $V_{PCTL\_HV}$ for PMOS FET $M_{11}$ is raised to the high logic voltage VDDPX (e.g., 1.8V) to turn off PMOS FET $M_{11}$. The gate bias voltage $V_{BIAS}$ of PMOS FET $M_{12}$ remains at the constant VDDPX/2 (e.g., 0.9V). Thus, the voltage $V_{PI}$ at the source of PMOS FET $M_{12}$ decreases and settles to less than a threshold voltage above $V_{PBIAS}$, for example, to <$V_{PBIAS}$+$V_T$ (e.g., <1.3V). Thus, both PMOS FETs $M_{11}$ and $M_{12}$ are turned off to isolate or decouple the output $V_{OUT}$ from VDDPX. Also, during this state or time interval, the control signal $V_{NCTL\_LV}$ is raised to a high logic voltage VDDIX (e.g., 0.9V) to turn on NMOS FET $M_{14}$. The turning on of NMOS FET $M_{14}$ causes the voltage $V_{NI}$ at the source of NMOS FET $M_{13}$ to decrease to substantially VSSX (e.g., 0V). The gate bias voltage $V_{NBIAS}$ of NMOS FET $M_{13}$ remains at VDDPX/2 (e.g., 0.9V). Thus, the gate-to-source voltage $V_{GS}$ of NMOS FET $M_{13}$ is greater than its threshold voltage $V_T$, thereby causing NMOS FET $M_{13}$ to turn on. Both NMOS FETs $M_{13}$ and $M_{14}$ being turned on causes the output signal $V_{OUT}$ to transition to and settle substantially at VSSX (e.g., 0V).

Once the voltages have transitioned, they will remain substantially constant during the state or time interval where the output signal $V_{OUT}$ is at substantially VSSX, as indicated in the third column from the left. That is, the control signal $V_{PCTL\_HV}$ is at the high logic voltage $V_{DDPX}$ and the bias voltage $V_{PBIAS}$ is at VDDPX/2 to keep devices $M_{11}$ and $M_{12}$ turned off to isolate or decouple the output $V_{OUT}$ from the first voltage rail ($V_{DDPX}$). The voltage $V_{PI}$ at the source of PMOS FET $M_{12}$ remains substantially constant less than a threshold voltage $V_T$ above $V_{PBIAS}$ (e.g., <1.3V). The control signal $V_{NCTL\_LV}$ is at the high logic voltage VDDIX and the bias voltage $V_{NBIAS}$ is at the constant VDDPX/2 to keep both devices $M_{14}$ and $M_{13}$ turned on to cause the output signal $V_{OUT}$ to be at the low logic voltage VSSX. Both devices $M_{13}$ and $M_{14}$ being turned on causes the voltage $V_{NI}$ at the source of NMOS FET $M_{13}$ to be at VSSX (e.g., 0V).

During the state or time interval where the output signal $V_{OUT}$ is transitioning from the low logic voltage VSSX to the high logic voltage VDDPX as indicated in the fourth column from the left, the control signal $V_{PCTL\_HV}$ for PMOS FET $M_{11}$ is lowered to the low logic voltage VSSIX (e.g., 0.9V) to turn on PMOS FET MW. The gate bias voltage $V_{PBIAS}$ for PMOS FET $M_{12}$ remains at the constant VDDPX/2 (e.g., 0.9V). Thus, both PMOS FETs $M_{11}$ and $M_{12}$ turn on. Accordingly, the voltage $V_{PI}$ at the source of PMOS FET $M_{12}$ as well as the output signal $V_{OUT}$ transition to the high logic voltage VDDPX (e.g., 1.8V). Also, during this state or time interval, the control signal $V_{NCTL\_LV}$ is lowered to the low logic voltage VSSX (e.g., 0V) to turn off NMOS FET $M_{14}$. The gate bias voltage $V_{NBIAS}$ of NMOS FET $M_{13}$ remains at the constant VDDPX/2 (e.g., 0.9V). Accordingly, the voltage $V_{NI}$ at the source of NMOS FET $M_{13}$ increases to more than a threshold voltage below $V_{NBIAS}$, to, for example, >0.5V. Thus, the gate-to-source voltage $V_{GS}$ of NMOS FET $M_{13}$ does not exceed its threshold voltage $V_T$, thereby causing NMOS FET $M_{13}$ to turn off. Both NMOS FETs $M_{13}$ and $M_{14}$ being turned off isolate or decouple the output signal $V_{OUT}$ from VSSX (e.g., 0V). Once the voltages have transitioned, they will remain substantially constant during the state or time interval where the output signal $V_{OUT}$ is at the high logic voltage $V_{DDPX}$, as indicated in the right-most column.

There are several issues with the I/O driver 100. For instance, if the devices $M_{11}$, $M_{12}$, $M_{14}$, and $M_{13}$ are manufactured in accordance with a certain technology node (e.g., to use the same technology node for all other non-I/O devices (e.g., core devices) in an IC or SOC), the maximum reliability voltage across any terminals ($V_{GS}$, $V_{GD}$, and $V_{DS}$) of these devices may be about 1.3V. If the devices are exposed to voltages above the reliable limit of 1.3V and for an extended period of time (e.g., a few picoseconds (ps) or more), recoverable or unrecoverable damage to these devices may result. Such damage may be due to negative bias temperature instability (NBTI) or hot carrier injection (HCI). As a consequence, the performance and functionality of the devices may degrade or completely fail.

With reference again to FIG. 1B, when the output signal $V_{OUT}$ is at the high logic voltage VDDPX as indicated in the left-most and right-most columns of the timing diagram, the voltage at the drain of NMOS FET $M_{13}$ is substantially at VDDPX (e.g., 1.8V) and the voltage at the source of NMOS FET $M_{13}$ is at 0.5V. Thus, the voltage difference (e.g., VDs) across the drain and source of NMOS FET $M_{13}$ is 1.3V. As previously discussed, this voltage differential of 1.3V across NMOS FET $M_{13}$ is close to exceeding the reliability limit of 1.3V if this device is manufactured in accordance with a particular implementation.

Further, during the state or time interval where the output signal $V_{OUT}$ is transitioning from VDDPX to VSSX as indicated in the second column from the left, the voltage $V_{NI}$ at the source of NMOS FET $M_{13}$ decreases from 0.5V to 0V at a rate much faster than the output signal $V_{OUT}$ decreases from 1.8V to 0V, due to generally a larger capacitive load $C_{LOAD}$ present at the output $V_{OUT}$ of the I/O driver 100. As a result, the voltage difference $V_{DS}$ across the drain and source of NMOS FET $M_{13}$ may increase up to about 1.5V during the transition of the output signal $V_{OUT}$ from VDDPX to VSSX, again exceeding the reliability limit of 1.3V if the device is manufactured in accordance with a particular implementation.

Similarly, when the output signal $V_{OUT}$ is at the low logic voltage VSSX as indicated in the third column from the left, the voltage at the drain of the PMOS FET $M_{12}$ is substantially at VSSX (e.g., 0V) and the voltage at the source of the PMOS FET $M_{12}$ is at 1.3V. Thus, the voltage difference (e.g., $V_{GS}$) across the drain and source of PMOS FET $M_{12}$ is 1.3V. As previously discussed, this voltage differential of 1.3V across PMOS FET $M_{12}$ is close to exceeding the reliability limit of 1.3V if this device is manufactured in accordance with a particular implementation.

Also, similarly, during the state or time interval where the output signal $V_{OUT}$ is transitioning from VSSX to VDDPX as indicated in the fourth column from the left, the voltage $V_{PI}$ at the source of PMOS FET $M_{12}$ increases from 1.3V to 1.8V at a rate much faster than the output signal $V_{OUT}$ increases from 0V to 1.8V due to generally the larger capacitive load $C_{LOAD}$ present at the output $V_{OUT}$ of the I/O driver 100. As a result, the voltage differential $V_{GS}$ across the drain and source of PMOS FET $M_{12}$ increases up to about 1.5V during the transition of the output signal $V_{OUT}$ from VSSX to VDDPX, again exceeding the reliability limit of 1.3V if the device is manufactured in accordance with a particular implementation. The resistors $R_P$ and $R_N$ are provided to absorb some of the overshoot of the $V_{DS}$ of PMOS FET $M_{12}$ and NMOS FET $M_{13}$. However, resistors $R_P$ and $R_N$ may be undesirable due to occupying significant IC footprint and producing unwanted electromagnetic (EM) energy.

Figure 2A:
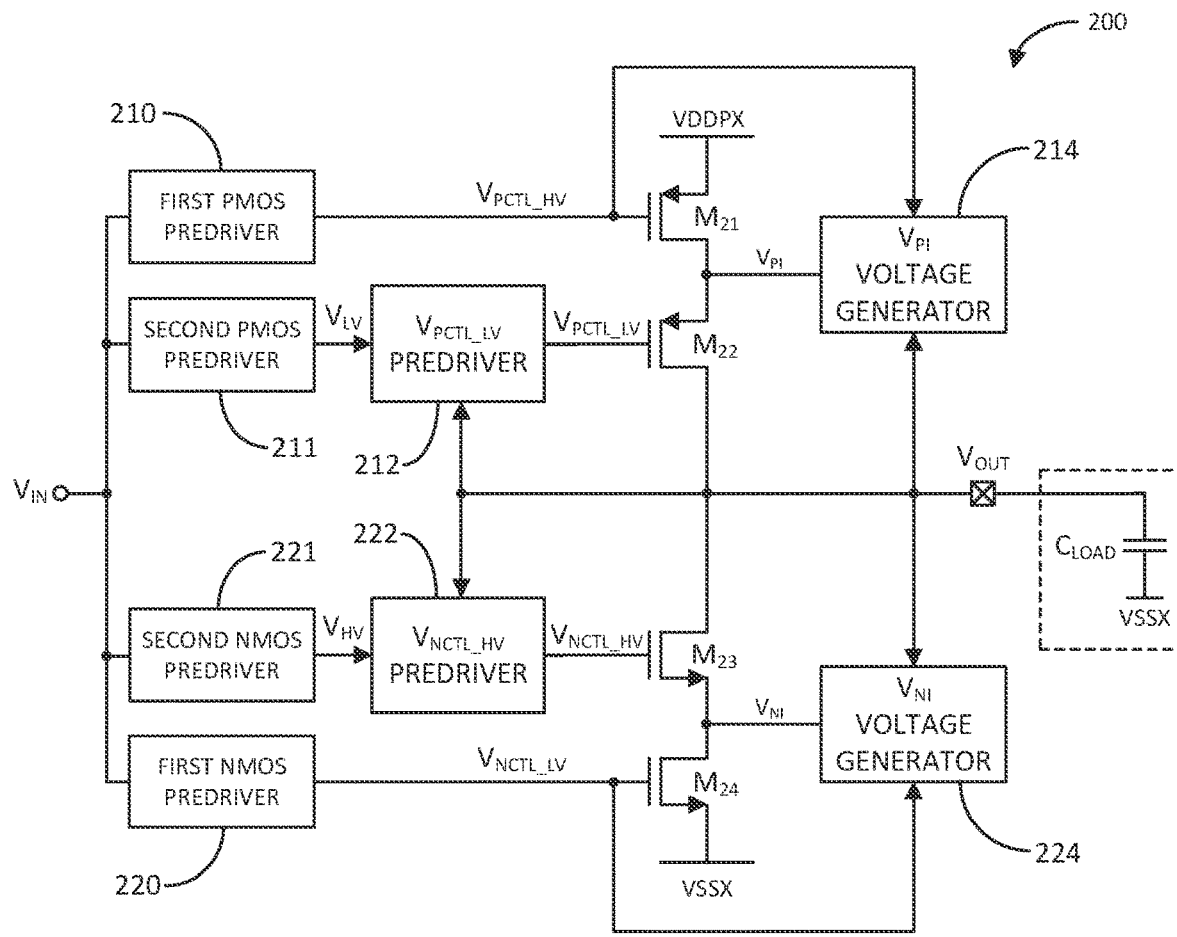
FIG. 2A illustrates a block/schematic diagram of an example input/output (I/O) circuit in accordance with another aspect of the disclosure.

FIG. 2A illustrates a schematic diagram of an input/output (I/O) circuit 200 in accordance with another aspect of the disclosure. One of the differences between I/O circuit 200 and I/O driver 100 is that the gate voltages applied to the PMOS FET $M_{22}$ and NMOS FET $M_{23}$ are not constant, but change or are boosted during transitions of the output signal $V_{OUT}$ from high-to-low logic voltages and from low-to-high logic voltages, respectively. This is done to reduce the maximum voltages across the buffer devices $M_{22}$ and $M_{23}$ to below their reliability limits during transitions of the output signal $V_{OUT}$, respectively. Additionally, the I/O circuit 200 applies bias voltages to the sources of $M_{22}$ and $M_{23}$ to prevent over-voltage of such devices when the output signal $V_{OUT}$ is at steady-state high and low logic voltages, respectively.

As an overview, the I/O circuit 200 is configured to receive an input voltage $V_{IN}$ from, for example, a core circuit of an IC or SOC. The input voltage $V_{IN}$ may swing between high and low logic voltages according to a first (e.g., core) voltage domain. In response to the high and low voltages of the input voltage $V_{IN}$, the I/O circuit 200 generates an output signal $V_{OUT}$ that swings between high and low logic voltages according to a second (e.g., PX) voltage domain, respectively. The high and low logic voltages of the second voltage domain may coincide substantially with VDDPX and VSSX. The I/O circuit 200 provides the output signal $V_{OUT}$ to a load having a capacitance $C_{LOAD}$.

More specifically, the I/O circuit 200 includes an output driver including a pull-up circuit including PMOS FETs $M_{21}$ and $M_{22}$ coupled in series between a first voltage rail VDDPX and the output $V_{OUT}$ of the I/O circuit 200. Similarly, the output driver includes a pull-down circuit including NMOS FETs $M_{23}$ and $M_{24}$ coupled in series between the output $V_{OUT}$ and a second voltage rail VSSX.

The I/O circuit 200 further includes a first PMOS predriver 210 configured to generate the control signal $V_{PCTL\_HV}$ in response to an input signal $V_{IN}$. As previously discussed, the HV voltage domain for $V_{PCTL\_HV}$ varies between a low logic voltage VSSIX (e.g., VDDPX/2) and a high logic voltage VDDPX. The I/O circuit 200 further includes a second PMOS predriver 211 configured to generate a control signal $V_{LV}$ in response to the input signal $V_{IN}$. The LV voltage domain for $V_{LV}$ varies between a low logic voltage VSSX and a high logic voltage VDDIX. Thus, when the input voltage $V_{IN}$ is low, $V_{PCTL\_HV}$ is at VDDPX and $V_{LV}$ is at VDDIX. When the input voltage $V_{IN}$ is high, $V_{PCTL\_HV}$ is at VSSIX and $V_{LV}$ is at VSSX.

Similarly, the I/O circuit 200 further includes a first NMOS predriver 220 configured to generate the control signal $V_{NCTL\_LV}$ in response to the input signal $V_{IN}$. The LV voltage domain for $N_{NCTL\_LV}$ varies between a low logic voltage VSSX and a high logic voltage VDDIX. The I/O circuit 200 further includes a second NMOS predriver 221 configured to generate a control signal $V_{HV}$ in response to the input signal $V_{IN}$. The HV voltage domain for $V_{HV}$ varies between a low logic voltage VSSIX and a high logic voltage VDDPX. Thus, when the input voltage $V_{IN}$ is low, $V_{NCTL\_LV}$ is at VDDIX and $V_{HV}$ is at VDDPX. When the input voltage $V_{IN}$ is high, $V_{NCTL\_LV}$ is at VSSX and $V_{NCTL\_HV}$ is at VSSIX.

The control signal $V_{PCTL\_HV}$ generated by the first PMOS predriver 210 is applied to the gate of PMOS FET $M_{21}$ and to a $V_{PI}$ voltage generator 214. The control signal $V_{LV}$ generated by the second PMOS predriver 211 is applied to a $V_{PCTL\_LV}$ predriver 212. Similarly, the control signal $V_{NCTL\_LV}$ generated by the first NMOS predriver 220 is applied to the gate of NMOS FET $M_{24}$ and to a $V_{NI}$ voltage generator 224. The control signal $V_{HV}$ generated by the second NMOS predriver 221 is applied to a $V_{NCTL\_HV}$ predriver 222. The $V_{PCTL\_LV}$ predriver 212 is configured to generate a control signal $V_{PCTL\_LV}$ based on $V_{LV}$ and $V_{OUT}$. The control signal $V_{PCTL\_LV}$ is applied to the gate of PMOS FET $M_{22}$. Similarly, the $V_{NCTL\_HV}$ predriver 222 is configured to generate a control signal $V_{NCTL\_HV}$ based on $V_{HV}$ and $V_{OUT}$. The control signal $V_{NCTL\_HV}$ is applied to the gate of NMOS FET $M_2$.

The $V_{PI}$ voltage generator 214 is configured to generate a voltage $V_{PI}$ based on $V_{PCTL\_HV}$ and $V_{OUT}$. The voltage $V_{PI}$ is applied to the source of PMOS FET $M_{22}$. The voltage $V_{PI}$ protects the PMOS FET $M_{22}$ from over-voltage when the output signal $V_{OUT}$ is at a steady-state low logic voltage VSSX. For example, when the output signal $V_{OUT}$ is at the steady-state low logic voltage VSSX (e.g., 0V), the voltage $V_{PI}$ is substantially at VDDIX (e.g., 0.9V). Due to the voltage $V_{PI}$, the drain-to-source voltage $V_{DS}$ of PMOS FET $M_{22}$ is, for example, 0.9V, below a reliability maximum voltage of, for example, 1.3V of the device.

Similarly, the $V_{NI}$ voltage generator 224 is configured to generate a voltage $V_{NI}$ based on $V_{NCTL\_LV}$ and $V_{OUT}$. The voltage $V_{NI}$ is applied to the source of NMOS FET $M_2$. The voltage $V_{NI}$ protects the NMOS FET $M_{23}$ from over-voltage when the output signal $V_{OUT}$ is at a steady-state high logic voltage VDDPX. For example, when the output signal $V_{OUT}$ is at the steady-state high logic voltage VDDPX (e.g., 1.8V), the voltage $V_{NI}$ is substantially at VDDIX (e.g., 0.9V). Due to the voltage $V_{NI}$, the drain-to-source voltage $V_{DS}$ of NMOS FET $M_{23}$ is, for example, 0.9V, below a reliability maximum voltage of, for example, 1.3V for the device.

Figure 2B:
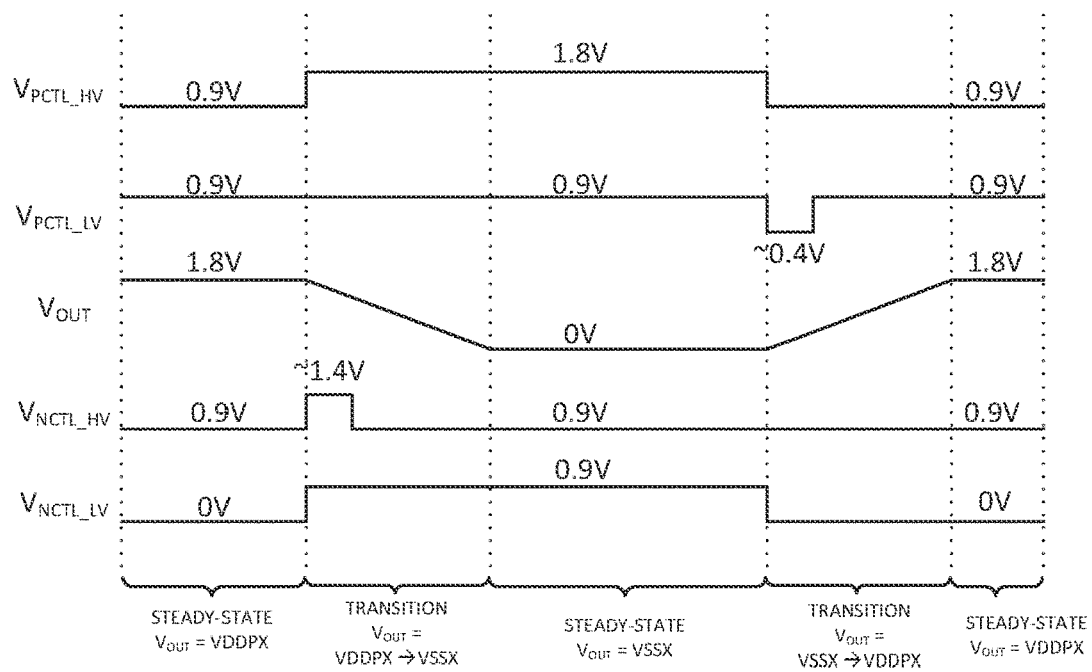
FIG. 2B illustrates a timing diagram of example signals relevant to the operation of the I/O circuit of FIG. 2A in accordance with another aspect of the disclosure.

FIG. 2B illustrates a timing diagram associated with an example operation of the I/O circuit 200 in accordance with another aspect of the disclosure. For explanation purposes, VDDPX is 1.8V, VDDIX/VSSIX is 0.9V, and VSSX is 0V. Also, for explanation purposes, the maximum reliability voltage for $V_{DS}$, $V_{GS}$, and $V_{DG}$ of devices $M_{21}$, $M_{22}$, $M_{22}$, and $M_{21}$ is 1.3V, as previously discussed. It shall be understood that such voltages and maximum reliability voltage may be different in various implementations based on the type of devices and applications used for the I/O circuit 200.

Similar to the graph of FIG. 1B, the horizontal axis of the timing diagram represents time, and is divided into four states or time intervals: (1) when the output signal $V_{OUT}$ is at a steady-state high logic voltage VDDPX, which is indicated in the left-most and right-most columns of the timing diagram; (2) when the output signal $V_{OUT}$ is transitioning from the high logic voltage VDDPX to a low logic voltage VSSX, which is indicated in the second column from the left; (3) when the output signal $V_{OUT}$ is at a steady-state low logic voltage VSSX, which is indicated in the third column from the left; and (4) when the output signal $V_{OUT}$ is transitioning from the low logic voltage VSSX to the high logic voltage VDDPX, which is indicated in the fourth column from the left.

The vertical axis of the timing diagram represents the various signals of the I/O circuit 200. For instance, from top to bottom, the signals are: (1) the control signal $V_{PCTL\_HV}$ for PMOS FET $M_{21}$; (2) the gate bias voltage $V_{PCTL\_LV}$ for PMOS FET $M_{22}$; (3) the output signal $V_{OUT}$; (4) the gate bias voltage $V_{NCTL\_HV}$ for NMOS FET $M_{23}$; and (5) the control signal $V_{NCTL\_LV}$ for NMOS FET $M_{24}$.

When the output signal $V_{OUT}$ is at a high logic voltage VDDPX (e.g., 1.8V) as indicated by the left-most and right-most columns, the control signal $V_{PCTL\_HV}$ is at a low logic voltage VSSIX (e.g., 0.9V) to turn on PMOS FET $M_{21}$, the voltage $V_{PI}$ at the source of PMOS FET $M_{22}$ is at VDDPX (e.g., 1.8V), and the control signal $V_{PCTL\_LV}$ is at a non-boosted voltage (e.g., 0.9V), which causes PMOS FET $M_{22}$ to turn on in response to PMOS FET $M_2$ turning on. Accordingly, the output signal $V_{OUT}$ is at a high logic voltage VDDPX (e.g., 1.8V) due to the first voltage rail VDDPX being coupled to the output $V_{OUT}$ via the turned-on PMOS FETs $M_{21}$ and $M_{22}$. Also, when the output signal $V_{OUT}$ is at the high logic voltage VDDPX (e.g., 1.8V), the control signal $V_{NCTL\_LV}$ is at a low logic voltage VSSX (e.g., 0V) to turn off NMOS FET $M_{24}$, the voltage $V_{NI}$ is at VDDIX (e.g., 0.9V) to maintain the VDS of NMOS FET $M_{23}$ below its reliability limit, and the control signal $V_{NCTL\_HV}$ is at a non-boosted voltage VSSIX (e.g., 0.9V), which turns off NMOS FET $M_{23}$. Accordingly, the output $V_{OUT}$ is decoupled from the second voltage rail VSSX due to the turned-off NMOS FETs $M_{23}$ and $M_{24}$.

To transition the output signal $V_{OUT}$ from the high logic voltage VDDPX (1.8V) to the low logic voltage VSSX (0V) as indicated in the second column from the left, the control signal $V_{NCTL\_LV}$ is changed from the low logic voltage VSSX (e.g., 0V) to the high logic voltage VDDIX (e.g., 0.9V) to turn on NMOS FET $M_{24}$. Simultaneous with $V_{NCTL\_LV}$ changing from low to high, the bias voltage $V_{NCTL\_HV}$ is boosted from a non-boosted voltage (e.g., ~VSSIX (e.g., 0.9V)) to boosted voltage (e.g., VSSIX+ ~0.5V=~1.4V). The boost voltage configures the respective turn-on resistances of NMOS FETs $M_{23}$ and $M_{24}$ to be more equalized (e.g., substantially the same) when the output signal $V_{OUT}$ initially transitions from high-to-low. In this example, this produces a 1.8V voltage drop between $V_{OUT}$ and VSSX to be equally divided among NMOS FETs $M_{23}$ and $M_{24}$; thus, causing the devices to each see a voltage drop of substantially 0.9V, which is below the 1.3V reliability limit.

When the output signal $V_{OUT}$ has decreased to a certain voltage level, the control signal $V_{NCTL\_HV}$ is brought back to the non-boosted voltage (e.g., ~VSSIX (0.9V)). The time interval in which the $V_{NCTL\_HV}$ is at the boosted voltage (e.g., ~1.4V) should be controlled to prevent over-voltage of NMOS FET $M_{23}$. For instance, if the time interval is too short, then NMOS FET $M_{23}$ may be subjected to over-voltage due to its $V_{DS}$ being above the reliability limit. If, on the other hand, the time interval is too long, then the device $M_{23}$ may be subjected to over-voltage due to its gate-to-source voltage ($V_{GS}$) and/or gate-to-drain voltage ($V_{GD}$) being above the reliability limit.

The time interval depends on the rate at which the output signal $V_{OUT}$ decreases from VDDPX to VSSX. Such rate depends on the capacitive load $C_{LOAD}$ coupled to the output of the I/O circuit 200. If the capacitance $C_{LOAD}$ of the load is relatively small, then the time interval should be relatively short because the rate at which output signal $V_{OUT}$ is decreasing is relatively high. If the capacitance $C_{LOAD}$ of the load is relatively large, then the time interval should be relatively long because the rate at which output signal $V_{OUT}$ is decreasing is relatively low. Accordingly, the $V_{NCTL\_HV}$ predriver 222 generates the boosted $V_{NCTL\_HV}$ voltage based on the rate at which output signal $V_{OUT}$ transitions from high-to-low.

Further, to facilitate the transition of the output signal $V_{OUT}$ from the high logic voltage VDDPX (e.g., 1.8V) to the low logic voltage VSSX (0V), the control signal $V_{PCTL\_HV}$ is changed from the low logic voltage VSSIX (e.g., 0.9V) to the high logic voltage VDDPX (e.g., 1.8V) to turn off PMOS FET $M_{21}$. In response to the output signal $V_{OUT}$ decreasing to a certain voltage level, the $V_{PI}$ voltage generator 214 generates the voltage $V_{PI}$ substantially at VDDPX (e.g., 0.9V). As the control signal $V_{PCTL\_LV}$ applied to gate of PMOS FET $M_{22}$ is maintained constant at VDDIX (e.g., 0.9V) during the transition of the output signal $V_{OUT}$ from high-to-low, PMOS FET $M_{22}$ turns off because its $V_{GS}$ is substantially at 0V. Accordingly, during the transition of the output signal $V_{OUT}$ from high-to-low, the pull-up circuit decouples the output from the first voltage rail VDDPX due to the turned off PMOS FETs $M_{21}$ and $M_{22}$.

When the output signal $V_{OUT}$ is at a steady-state low logic voltage VSSX (0V) as indicated in the third column from the left, the control signal $V_{NCTL\_LV}$ is at the high logic voltage VDDIX (e.g., 0.9V) to maintain NMOS FET $M_{24}$ turned on, the control signal $V_{NCTL\_HV}$ is at the non-boosted voltage VDDIX (e.g., 0.9V), which maintains NMOS FET $M_{23}$ turned on. Thus, output signal $V_{OUT}$ receives VSSX (0V) from the second voltage rail via the turned-on NMOS FETs $M_{23}$ and $M_{24}$. It follows that the voltage $V_{NI}$ is also at VSSX (0V). Also, when the output signal $V_{OUT}$ is at the steady-state low logic voltage VSSX (0V), the control signal $V_{PCTL\_HV}$ is at a high logic voltage VDDPX (e.g., 1.8V) to maintain PMOS FET $M_{21}$ turned off, the voltage $V_{PI}$ is at VSSIX (e.g., 0.9V) to protect PMOS FET $M_{22}$ from over-voltage as discussed, and the control signal $V_{PCTL\_HV}$ is at the non-boosted voltage VDDIX (e.g., 0.9V), which maintains PMOS FET $M_2$ turned off. Thus, the output of the I/O circuit 200 is decoupled from the first voltage rail VDDPX via the turned-off PMOS FETs $M_{21}$ and $M_{22}$.

To transition the output signal $V_{OUT}$ from the low logic voltage VSSX (e.g., 0V) towards the high logic voltage VDDPX (e.g., 1.8V) as indicated in the fourth column from the left, the control signal $V_{PCTL\_HV}$ is changed from the high logic voltage VDDPX (e.g., 1.8V) to the low logic voltage VSSIX (e.g., 0.9V) to turn on PMOS FET $M_{21}$. Simultaneous with $V_{PCTL\_HV}$ changing from high to low, the control signal $V_{PCTL\_LV}$ is changed from the non-boosted voltage (e.g., 0.9V) to the boosted voltage (e.g., ~0.4V). This is done to configure the respective turn-on resistances of PMOS FETs $M_{21}$ and $M_{22}$ to be more equalized (e.g., substantially the same) when the output signal $V_{OUT}$ initially transitions from low-to-high. In this example, this causes the 1.8V voltage drop between VDDPX and $V_{OUT}$ to be divided equally among PMOS FETs $M_{21}$ and $M_{22}$, thus, causing the devices to each see a voltage drop of substantially 0.9V, which is below the 1.3V reliability limit.

When the output signal $V_{OUT}$ has increased to a certain voltage level, the control signal $V_{PCTL\_LV}$ is brought back to the non-boosted voltage (e.g., VDDIX (e.g., 0.9V)). The time interval in which the $V_{PCTL\_LV}$ is at the boosted voltage (e.g., ~0.4V) should be controlled to prevent over-voltage of PMOS FET $M_2$. For instance, if the time interval is too short, then PMOS FET $M_{22}$ may be subjected to over-voltage due to its $V_{GS}$ being above the reliability limit. If, on the other hand, the time interval is too long, then the device $M_{22}$ may be subjected to over-voltage due to its gate-to-source voltage ($V_{GS}$) and/or gate-to-drain ($V_{GD}$) being above the reliability limit.

The time interval depends on the rate at which the output signal $V_{OUT}$ increases from VSSX to VDDPX. Such rate depends on the capacitive load $C_{LOAD}$ coupled to the output of the I/O circuit 200. If the capacitance $C_{LOAD}$ of the load is relatively small, then the time interval should be relatively short because the rate at which output signal $V_{OUT}$ is increasing is relatively high. If the capacitance $C_{LOAD}$ of the load is relatively large, then the time interval should be relatively long because the rate at which output signal $V_{OUT}$ is increasing is relatively low. Accordingly, the $V_{PCTL\_LV}$ predriver 212 generates the boosted $V_{PCTL\_LV}$ voltage based on the rate at which output signal $V_{OUT}$ transitions from low-to-high.

Further, to facilitate the transition the output signal $V_{OUT}$ from the low logic voltage VSSX (e.g., 0V) towards the high logic voltage VDDPX (e.g., 1.8V), the control signal $V_{NCTL\_LV}$ is changed from the high logic voltage VDDIX (e.g., 0.9V) to the low logic voltage VSSX (e.g., 0V) to turn off NMOS FET $M_{24}$. In response to the output signal $V_{OUT}$ increasing to a certain voltage level, the $V_{NI}$ voltage generator 224 generates the voltage $V_{NI}$ substantially at VDDIX (e.g., 0.9V). As the control signal $V_{NCTL\_HV}$ applied to gate of NMOS FET $M_{23}$ is maintained constant at VSSIX (e.g., 0.9V) during the transition of the output signal $V_{OUT}$ from low-to-high, NMOS FET $M_{23}$ turns off because its $V_{GS}$ is substantially at 0V. Accordingly, during the transition of the output signal $V_{OUT}$ from low-to-high, the pull-down circuit decouples the output from the second voltage rail VSSX due to the turned off NMOS FETs $M_{21}$ and $M_{22}$.

There are several issues with the I/O circuit 200. First, there is just one gate boosting during each transition of the output signal $V_{OUT}$. For example, NMOS FET $M_{23}$ is the only device boosted during a high-to-low transition of the output signal $V_{OUT}$, and PMOS FET $M_{22}$ is the only device boosted during a low-to-high transition of the output signal $V_{OUT}$. Boosting more than just one FET during a transition would produce faster transitions, thereby allowing the I/O driver to operate much faster.

Secondly, as illustrated in FIG. 2B, the gate boosting in I/O circuit 200 is only about 30 percent (%) of the duration of the transition. Providing a greater percentage boosting interval during each transition would also expedite transitions, again, allowing an I/O driver to operate much faster. An additional drawback of the relatively small boosting duration (e.g., 30%) is that the output impedance changes during each transition. For example, during a boosting interval, the output impedance is significantly less than during the remaining or non-boosting interval of a transition. The change in output impedance during each transition may cause signal integrity (SI) issues in the output signal $V_{OUT}$.

Third, the pull-up circuit (e.g., PMOS FETs $M_{21}$ and $M_{22}$) and the pull-down circuit (e.g., NMOS FETs $M_{23}$ and $M_{24}$) are driven by different domain signals. For example, the PMOS FETs $M_{21}$ and $M_{22}$ of the pull-up circuit are driven by control signals $V_{PCTL\_HV}$ and $V_{PCTL\_LV}$, which are in the HV and LV voltage domains, respectively. Similarly, the NMOS FETs $M_{23}$ and $M_{24}$ of the pull-down circuit are driven by control signals $V_{NCTL\_HV}$ and $V_{NCTL\_LV}$, which are in the HV and LV voltage domains, respectively. Since the HV and LV domain signals propagate via different transmission paths, there could be delay mismatch between these signals, which may adversely affect the operation (e.g., produce duty cycle distortion in the output signal $V_{OUT}$) and reliability (e.g., subject the FETs to over-voltage stress or damage). As an example, if during a low-to-high transition, the rising edge of the $V_{PCTL\_HV}$ arrives before falling edge of the $V_{PCTL\_LV}$, PMOS FET $M_{22}$ may be stressed or damaged due to over-voltage, or if the rising edge of $V_{PCTL\_HV}$ arrives after the falling edge of the $V_{PCTL\_LV}$, PMOS FET $M_{21}$ may be stressed or damaged due to over-voltage. The same adverse effects apply to NMOS FETs $M_{23}$ and $M_{24}$ during a high-to-low transition.

Figure 3A:
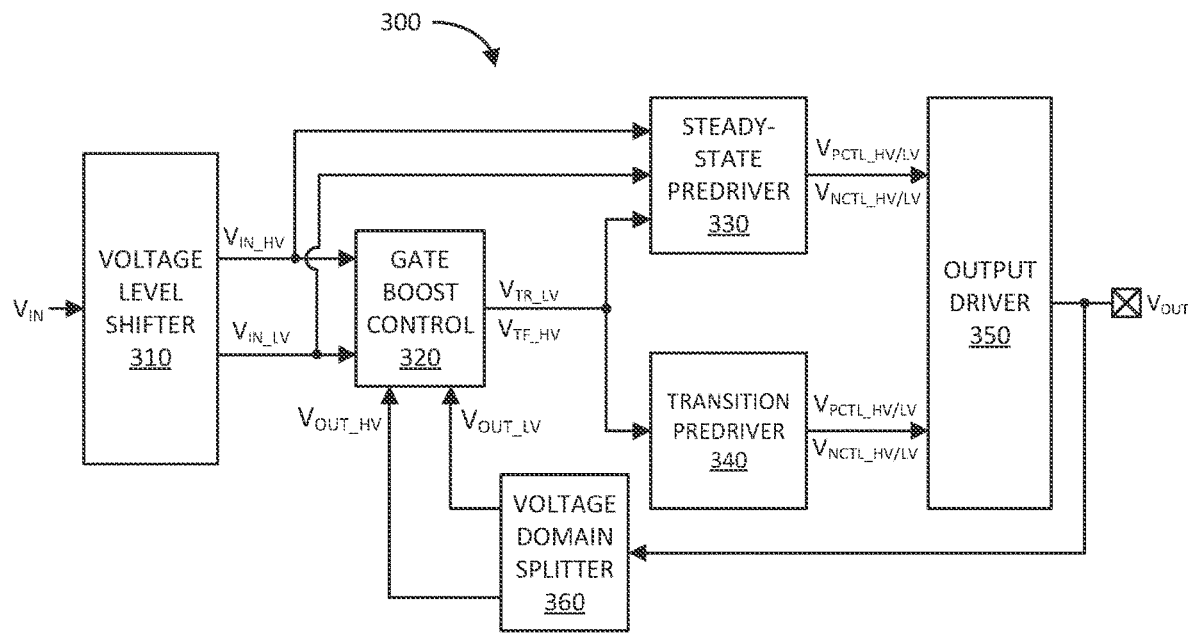
FIG. 3A illustrates a schematic diagram of another example input/output (I/O) circuit in accordance with another aspect of the disclosure.

FIG. 3A illustrates a schematic diagram of another example input/output (I/O) circuit 300 in accordance with another aspect of the disclosure. In summary, the I/O circuit 300 employs one or more predrivers that boosts both or all FETs of pull-up and pull-down circuits of the I/O circuit 300 during rising and falling transitions, respectively. This allows for faster transitions, which improves the speed of the I/O circuit 300.

Further, the one or more predrivers boosts both or all FETs of the pull-up and pull-down circuits for a longer percentage (e.g., 80%) of the transition interval. Again, this also allows for faster transitions and higher speed performance of the I/O circuit 300. Additionally, the longer boosting interval during a transition reduces the effects of output impedance change, thereby reducing signal integrity (SI) degradation of the output signal $V_{OUT}$.

Additionally, the generation of the control signals $V_{PCTL\_HV}$ and $V_{PCTL\_LV}$ for the pull-up circuit or the control signals $V_{NCTL\_HV}$ and $V_{NCTL\_LV}$ for the pull-down circuit are responsive to a single domain signal, which prevents or reduces delay mismatch between the signals which, as previously discussed, may cause duty cycle distortion in the output signal $V_{OUT}$ and over-voltage stress or damage to the FETs of the output driver. Further, the current load demand for the intermediate voltage rail VDDIX or VSSIX is reduced by implementing predrivers responsible for transitions to only use the VDDPX voltage rail, which may already be configured to handle higher current loads.

In particular, the I/O circuit 300 includes a voltage level shifter 310, a gate boost control circuit 320, a steady-state predriver 330, a transition predriver 340, an output driver 350, and a voltage domain splitter 360. The voltage level shifter 310 is configured to receive an input signal $V_{IN}$, which may be in an IC or SOC core voltage domain, which may be referred to herein as a CX domain, and where the voltage varies between a logic high of VDDCX (e.g., 1.1V) and a logic low of VSSCX (e.g., 0.5V). The voltage level shifter 310 is configured to voltage level shift the input signal $V_{IN}$ to generate input signals $V_{IN\_HV}$ and $V_{IN\_LV}$ in the HV and LV voltage domains, respectively. The input signal $V_{IN\_LV}$ may swing between a high logic voltage VDDPX (e.g., 1.8V) and a low logic voltage VSSIX (e.g., 0.9V); and the input signal $V_{IN\_LV}$ may swing between a high logic voltage VDDIX (e.g., 0.9V) and a low logic voltage VSSX (e.g., 0V).

The gate boost control circuit 320 is configured to generate gate boosting enable signals $V_{TR\_LV}$ and $V_{TF\_HV}$ for enabling the gate boosting of the PMOS FETs $M_{21}$ and $M_{22}$ of the pull-up circuit and the NMOS FETs $M_{23}$ and $M_{24}$ of the pull-down circuit of the output driver 350, respectively. As indicated, the output driver 350 may be configured per output driver of I/O circuit 200. The gate boost control circuit 320 is configured to generate the gate boosting enable signals $V_{TR\_LV}$ and $V_{TF\_HV}$ based on the input signals $V_{IN\_HV}$ and $V_{IN\_LV}$ and output voltage signals $V_{OUT\_HV}$ and $V_{OUT\_LV}$ generated by voltage domain splitter 360 by splitting the PX voltage domain of the output signal $V_{OUT}$. As indicated by the subscripts, the output signal $V_{OUT\_HV}$ is in the HV voltage domain, and the output signal $V_{OUT\_LV}$ is in the LV voltage domain. As discussed in more detail herein, the input signal $V_{IN}$ via the associated signals $V_{IN\_HV}$ and $V_{IN\_LV}$ initiates the start of a gate boosting interval, and the output signal $V_{OUT}$ via the associated signals $V_{OUT\_HV}$ and $V_{OUT\_LV}$ terminates the gate boosting interval.

The steady-state predriver 330 is configured to generate the control signals $V_{PCTL\_HV}$, $V_{PCTL\_LV}$, $V_{NCTL\_HV}$, and $V_{NCTL\_LV}$ for the PMOS FETs $M_{21}$ and $M_{22}$ and NMOS FETs $M_{23}$ and $M_{24}$ of the output driver 350 during the steady-state intervals, respectively. A steady-state interval is the time interval when the output signal $V_{OUT}$ is not transitioning from one logic level or state to another logic level or state. As discussed in more detail further herein, the steady-state predriver 330 generates the control signals $V_{PCTL\_HV}$, $V_{PCTL\_LV}$, $V_{NCTL\_HV}$, and $V_{NCTL\_LV}$ based on the input signals $V_{IN\_HV}$ and $V_{IN\_LV}$ and the gate boosting enable signals $V_{TR\_LV}$ and $V_{TF\_HV}$.

Figure 3B:
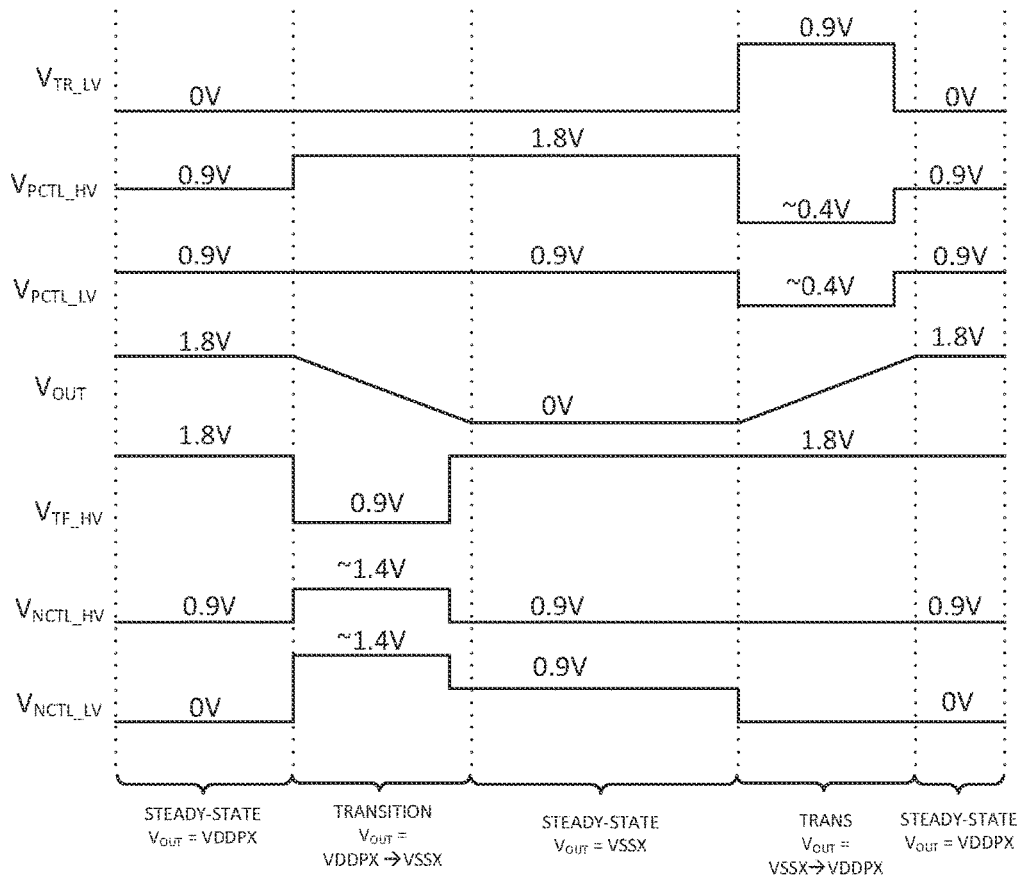
FIG. 3B illustrates a timing diagram of example signals relevant to the operation of the I/O circuit of FIG. 3A in accordance with another aspect of the disclosure.

With reference to the timing diagram of FIG. 3B, when the output signal $V_{OUT}$ is at a steady-state high logic voltage VDDPX (e.g., 1.8V), the steady-state predriver 330 generates the control signals $V_{PCTL\_HV}$, $V_{PCTL\_LV}$, $V_{NCTL\_HV}$, and $V_{NCTL\_LV}$ at a low logic voltage VSSIX (e.g., 0.9V), a non-boosted voltage (e.g., 0.9V), a non-boosted voltage (e.g., 0.9V), and a low logic VSSX (e.g., 0V), respectively. These voltage levels turn on PMOS FETs $M_{21}$ and $M_{22}$ and turn off NMOS FETs $M_{23}$ and $M_{24}$ so that the output signal $V_{OUT}$ is maintained substantially steady at VDDPX (e.g., 1.8V). Note that, during the VDDPX steady-state interval, the gate boost control circuit 320 generates gate boosting enable signals $V_{TR\_LV}$ and the $V_{TF\_HV}$, which are in the LV and HV voltage domains and pertain to the rising and falling transitions, in their deasserted low VSSX (e.g., 0V) and high logic states VDDPX (e.g., 1.8V), respectively.

When the output signal $V_{OUT}$ is at a steady-state logic low voltage VSSX (e.g., 0V), the steady-state predriver 330 generates the control signals $V_{PCTL\_HV}$, $V_{PCTL\_LV}$_v, $V_{NCTL\_HV}$, and $V_{NCTL\_LV}$ at a high logic voltage VDDPX (e.g., 1.8V), the non-boosted voltage (e.g., 0.9V), the non-boosted voltage (e.g., 0.9V), and a high logic voltage VDDIX (e.g., 0.9V). These voltage levels turn off PMOS FETs $M_{21}$ and $M_{22}$ and turn on NMOS FETs $M_{23}$ and $M_{24}$ so that the output signal $V_{OUT}$ is maintained substantially steady at VSSX (e.g., 0V). Similarly, during the VSSX steady-state interval, the gate boost control circuit 320 generates the gate boosting enable signals $V_{TR\_LV}$ and the $V_{TF\_HV}$ in their deasserted low VSSX (e.g., 0V) and high VDDPX (e.g., 1.8V) logic states, respectively.

The transition predriver 340 is configured to generate the control signals $V_{PCTL\_HV}$, $V_{PCTL\_LV}$, $V_{NCTL\_HV}$, and $V_{NCTL\_LV}$ for the PMOS FETs $M_{21}$ and $M_{22}$ and NMOS FETs $M_3$ and $M_{24}$ of the output driver 350 during the transition intervals, respectively. A transition interval is the time interval when the output signal $V_{OUT}$ is transitioning from one logic level or state to another logic level or state. As discussed in more detail further herein, the transition predriver 340 generates the control signals $V_{PCTL\_HV}$, $V_{PCTL\_LV}$, $V_{NCTL\_HV}$, and $V_{NCTL\_LV}$ based on the gate boosting enable signals $V_{TR\_LV}$ and $V_{TF\_HV}$.

With reference to the timing diagram of FIG. 3B, when the output signal $V_{OUT}$ is to be transitioned from a high logic voltage VDDPX (e.g., 1.8V) to a low logic voltage VSSX (e.g., 0V) as indicated by the input signals $V_{IN\_HV}$ and $V_{IN\_LV}$ changing to low logic voltages, the gate boost control circuit 320 generates the gate boosting enable signal $V_{TF\_HV}$ in its asserted low logic state VSSIX (e.g., 0.9V) and maintains the gate boosting enable signal $V_{TR\_LV}$ in its deasserted low logic state VSSX (e.g., 0V). In response to the deasserted gate boosting enable signal $V_{TR\_LV}$, the steady-state predriver 330 generates the control signals $V_{PCTL\_HV}$, $V_{PCTL\_LV}$ at a high logic voltage VDDPX (e.g., 1.8V) and a non-boosted voltage (e.g., 0.9V), respectively. These voltage levels turn off PMOS FETs $M_{21}$ and $M_{22}$.

In response to the asserted gate boosting enable signal $V_{TF\_HV}$, the transition predriver 340 generates the control signals $V_{NCTL\_HV}$ and $V_{NCTL\_LV}$ at the boosted voltage levels (e.g., ~1.4V). The control signals at these voltage levels turn on NMOS FETs $M_{23}$ and $M_{24}$ such that their turn-on resistance is less than the turn-on resistance when the NMOS FETs $M_{23}$ and $M_{24}$ are driven by the 0.9V during the steady-state low logic state VSSX of the output signal $V_{OUT}$. Because of the gate boosting of NMOS FETs $M_{23}$ and $M_{24}$, the output signal $V_{OUT}$ transitions quickly from VDDPX (e.g., 1.8V) to VSSX (e.g., 0V). At about 80% of the high-to-low transition of the output signal $V_{OUT}$, the gate boost control circuit 320 deasserts the gate boosting enable signal $V_{TF\_HV}$ (e.g., brings it back to VDDPX (e.g., 1.8V)). In response, the transition predriver 340 hands over control of the $V_{NCTL\_HV}$ and $V_{NCTL\_LV}$ signals to the steady-state predriver 330, which changes their states to the non-boosted voltage levels VDDIX and VSSIX (e.g., both 0.9V), respectively.

When the output signal $V_{OUT}$r is to be transitioned from a low logic voltage VSSX (e.g., 0V) to a high logic voltage VDDPX (e.g., 1.8V) as indicated by the input signals $V_{IN\_HV}$ and $V_{IN\_LV}$ changing to high logic voltages, the gate boost control circuit 320 generates the gate boosting enable signal $V_{TR\_LV}$ in its asserted low logic state VDDIX (e.g., 0.9V) and maintains the gate boosting enable signal $V_{TF\_HV}$ in its deasserted high logic state VDDPX (e.g., 1.8V). In response to the deasserted gate boosting enable signal $V_{TF\_HV}$, the steady-state predriver 330 generates the control signals $V_{NCTL\_HV}$ and $V_{NCTL\_LV}$ at the non-boosted voltage (e.g., 0.9V) and a low logic voltage VSSX (e.g., 0V), respectively. The control signals at these voltage levels turn off NMOS FETs $M_{23}$ and $M_{24}$.

In response to the asserted gate boosting enable signal $V_{TR\_LV}$, the transition predriver 340 generates the control signals $V_{PCTL\_HV}$ and $V_{PCTL\_LV}$ at the boosted voltage levels (e.g., −0.4V). These voltage levels turn on PMOS FETs $M_{21}$ and $M_{22}$ such that their turn-on resistance is less than the turn-on resistance when the PMOS FETs $M_{21}$ and $M_{22}$ are driven by the non-boosted voltage, e.g., 0.9V, during the steady-state low logic state VSSX of the output signal $V_{OUT}$. Because of the gate boosting of PMOS FETs $M_{21}$ and $M_{22}$, the output signal $V_{OUT}$ transitions quickly from VSSX (e.g., 0V) to VDDPX (e.g., 1.8V). At about 80% of the low-to-high transition of the output signal $V_{OUT}$, the gate boost control circuit 320 deasserts the gate boosting enable signal $V_{TR\_LV}$ (e.g., brings it back to VSSX (e.g., 0V)). In response, the transition predriver 340 hands over control of the $V_{PCTL\_HV}$ and $V_{PCTL\_LV}$ signals to the steady-state predriver 330, which changes their states to the non-boosted voltage levels VSSIX and VDDIX (e.g., both 0.9V), respectively.

Figure 4:
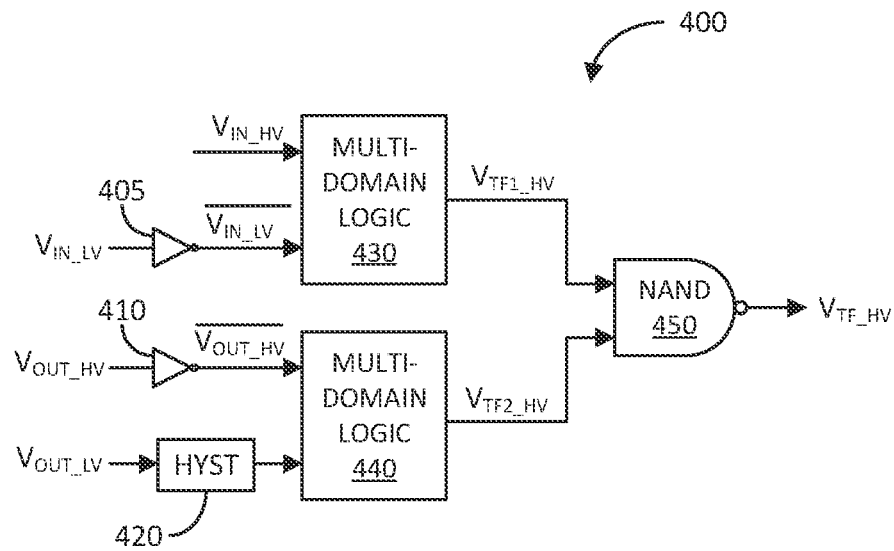
FIG. 4 illustrates a block diagram of an example pull-down gate boost control circuit in accordance with another aspect of the disclosure.

FIG. 4 illustrates a block diagram of an example pull-down gate boost control circuit 400 in accordance with another aspect of the disclosure. The pull-down gate boost control circuit 400 may be an example detailed implementation of the pull-down side or portion of the gate boost control circuit 320 previously discussed. That is, the gate boost control circuit 400 is configured to generate the pull-down gate boosting enable signal $V_{TF\_HV}$ based on the input signals $V_{IN\_HV}$ and $V_{IN\_LV}$, and the output signals $V_{OUT\_HV}$ and $V_{OUT\_LV}$. As previously discussed, the pull-down gate boost control circuit 400 generates the gate boosting enable signal $V_{TF\_HV}$ at an asserted low logic voltage VSSIX (e.g., 0.9V) during a falling transition interval (e.g., 80% thereof) of the output signal $V_{OUT}$, and at a deasserted high logic voltage VDDPX (e.g., 1.8V) during the steady-state and rising transition intervals.

In particular, the pull-down gate boost control circuit 400 includes first and second inverters 405 and 410, a hysteresis logic device 420, a first multi-domain logic circuit 430, a second multi-domain logic circuit 440, and a logic gate 450 (e.g., a NAND gate). A multi-domain logic circuit is a logic circuit that operates on signals in different voltages domains (e.g., HV and LV voltage domains). The first inverter 405 is configured to receive and invert the input signal $V_{IN\_LV}$ in the LV voltage domain to generate a complementary input signal $\overline{V_{IN\_LV}}$ also in the LV voltage domain. The second inverter 410 is configured to receive and invert the output signal $V_{OUT\_HV}$ in the HV voltage domain to generate a complementary output signal $\overline{V_{OUT\_HV}}$ also in the HV voltage domain.

The first multi-domain logic circuit 430 is configured to receive the input signal $V_{IN\_HV}$ in the HV voltage domain and the complementary input signal $\overline{V_{IN\_LV}}$, and generate a pull-down gate boosting initiating signal $V_{TF1\_HV}$ in the HV voltage domain. The second multi-domain logic circuit 440 is configured to receive the complementary output signal $\overline{V_{OUT\_HV}}$ and the output signal $V_{OUT\_LV}$ in the LV voltage domain, and generate therefrom a pull-down gate boosting terminating signal $V_{TF2\_HV}$ in the HV voltage domain. The second multi-domain logic circuit 440 may be configured to receive the output signal $V_{OUT\_LV}$ via the hysteresis logic device 420. The hysteresis logic device 420 has two switching thresholds: an upper threshold where the hysteresis logic device 420 generates a high logic voltage upon the signal $V_{OUT\_LV}$ rising above the upper threshold, and a lower threshold where the hysteresis logic device 420 generates a low logic voltage upon the signal $V_{OUT\_LV}$ falling below the lower threshold. This is done so that the pull-down gate boosting terminating signal $V_{TF2\_HV}$ changes in response to a lower voltage of $V_{OUT\_LV}$. This has the effect of delaying the termination of the gate boosting interval. The NAND gate 450 logically NANDs the gate boosting initiating and terminating signals $V_{TF1\_HV}$ and $V_{TF2\_HV}$ to generate the pull-down gate boosting enable signal $V_{TF\_HV}$ in the HV voltage domain.

As previously discussed, the input signal $V_{IN}$ initiates the pull-down gate boosting interval and the output signal $V_{OUT}$ terminates the pull-down gate boosting interval. Prior to the falling transition, the input and output signals $V_{IN}$ and $V_{OUT}$ are at high logic steady-states. In response to the input signal $V_{IN}$ being logically high, the voltage level shifter 310 generates the input signals $V_{IN\_HV}$ and $V_{IN\_LV}$ logically high VDDPX (e.g., 1.8V) and VDDIX (e.g., 0.9V), respectively. Similarly, in response to the output signal $V_{OUT}$ being logically high, the voltage domain splitter 460 generates the output signals $V_{OUT\_HV}$ and $V_{OUT\_LV}$ logically high VDDPX (e.g., 1.8V) and VDDIX (e.g., 0.9V).

In the current implementation, the first multi-domain logic circuit 430 inverts the signal $V_{IN\_HV}$ to generate the pull-down gate boosting initiating signal $V_{TF1\_HV}$. As the signal $V_{IN\_HV}$ is logically high, the pull-down gate boosting initiating signal $V_{TF1\_HV}$ is logically low. Similarly, the second multi-domain logic circuit 440 inverts the signal $\overline{V_{OUT\_HV}}$ to generate the pull-down gate boosting terminating signal $V_{TF2\_HV}$. As the signal $\overline{V_{OUT\_HV}}$ is logically low, the pull-down gate boosting terminating signal $V_{TF2\_HV}$ is logically high. As the NAND gate 450 sees logically low and high input signals $V_{TF1\_HV}$ and $V_{TF2\_HV}$, the NAND gate 450 generates the pull-down gate boosting enable signal $V_{TF\_HV}$ in its deasserted high logic state VDDPX (e.g., 1.8V), as the output signal $V_{OUT}$ is at a steady-state high VDDPX.

When the input signal $V_{IN}$ subsequently transitions to a low logic state, the voltage level shifter 310 generates the input signals $V_{IN\_HV}$ and $\overline{V_{IN\_LV}}$ at logically low VSSIX (e.g., 0.9V) and logically high VDDIX (e.g., 0.9V) states, respectively. In response, the first multi-domain logic circuit 430 inverts the low logic signal $V_{IN\_HV}$ to generate the pull-down gate boosting initiating signal $V_{TF1\_HV}$ as an asserted high logic voltage VDDPX (e.g., 1.8V). As the NAND gate 450 now sees logically high input signals $V_{TF1\_HV}$ and $V_{TF2\_HV}$, the NAND gate 450 generates the pull-down gate boosting enable signal $V_{TF\_HV}$ in the asserted low logic level VSSIX (e.g., 0.9V) to initiate the pull-down gate boosting interval. As previously mentioned, the pull-down gate boosting interval is initiated in response to the input signal $V_{IN}$ transitioning to a low logic state.

When the output signal $V_{OUT}$ substantially transitions to a low logic state, the voltage domain splitter 360 generates the output signals $V_{OUT\_HV}$ and $V_{OUT\_LV}$ at logic low states VSSIX (e.g., 0.9V) and VSSX (e.g., 0V), respectively. In response, the second multi-domain logic circuit 440 inverts the high logic signal $\overline{V_{OUT\_HV}}$ to generate the pull-down gate boosting terminating signal $V_{TF2\_HV}$ as an asserted low logic voltage VSSIX (e.g., 0.9V). As the NAND gate 450 now sees logically high and low input signals $V_{TF1\_HV}$ and $V_{TF2\_HV}$, the NAND gate 450 generates the pull-down gate boosting enable signal $V_{TF\_HV}$ in its deasserted high logic state VDDPX (e.g., 1.8V) to terminate the pull-down gate boosting interval. As previously mentioned, the pull-down gate boosting interval is terminated in response to the output signal $V_{OUT}$ transitioning to a low logic state.

Figure 5:
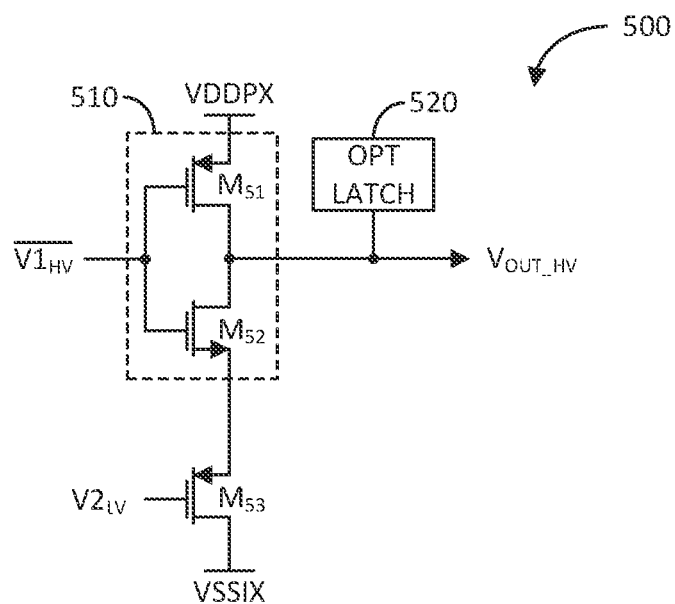
FIG. 5 illustrates a schematic diagram of an example multi-domain logic circuit of the pull-down gate boosting control circuit of FIG. 4 in accordance with another aspect of the disclosure.

FIG. 5 illustrates a block diagram of an example multi-domain logic circuit 500 in accordance with another aspect of the disclosure. The multi-domain logic circuit 500 includes an inverter 510 including a first FET $M_{51}$ and a second FET $M_{52}$. The first FET $M_{51}$ may be implemented as a PMOS FET, and the second FET $M_{52}$ may be implemented as an NMOS FET. The multi-domain logic circuit 500 further includes a third FET $M_{53}$, which may be implemented as a PMOS FET. The inverter 510 and the PMOS FET $M_{53}$ are coupled in series between an upper voltage rail VDDPX and a lower voltage rail VSSIX (e.g., associated with the HV voltage domain).

The PMOS FET $M_{53}$ includes a gate configured to receive a signal $V2_{LV}$. With reference to the pull-down gate boost control circuit 400, the signal $V2_{LV}$ may be the complementary input signal $\overline{V_{IN\_LV}}$ if the multi-domain logic circuit 500 corresponds to the first multi-domain logic circuit 430, or the output signal $V_{OUT\_LV}$ if the multi-domain logic circuit 500 corresponds to the second multi-domain logic circuit 440.

The PMOS FET $M_{51}$ and the NMOS FET $M_{52}$ include respective gates coupled together to form an input of the inverter 510, and configured to receive the complementary signal $\overline{V1_{HV}}$. With reference to the pull-down gate boost control circuit 400, the complementary signal $\overline{V1_{HV}}$ may be the input signal $V_{IN\_HV}$ if the multi-domain logic circuit 500 corresponds to the first multi-domain logic circuit 430, or the complementary output-based signal $\overline{V_{OUT\_HV}}$ if the multi-domain logic circuit 500 corresponds to the second multi-domain logic circuit 440.

The PMOS FET $M_{51}$ and the NMOS FET $M_{52}$ include respective drains coupled together to form an output of the inverter 510, and configured to generate the output signal $V_{OUT\_HV}$. With reference to the pull-down gate boost control circuit 400, the output signal $V_{OUT\_HV}$ may be the pull-down gate boosting initiating signal $V_{TF1\_HV}$ if the multi-domain logic circuit 500 corresponds to the first multi-domain logic circuit 430, or the pull-down gate boosting terminating signal $V_{TF2\_HV}$ if the multi-domain logic circuit 500 corresponds to the second multi-domain logic circuit 440. The multi-domain logic circuit 500 may optionally include a latch 520 (e.g., cross-coupled inverters) configured to latch the logic state of the $V_{OUT\_HV}$.

Figure 6:
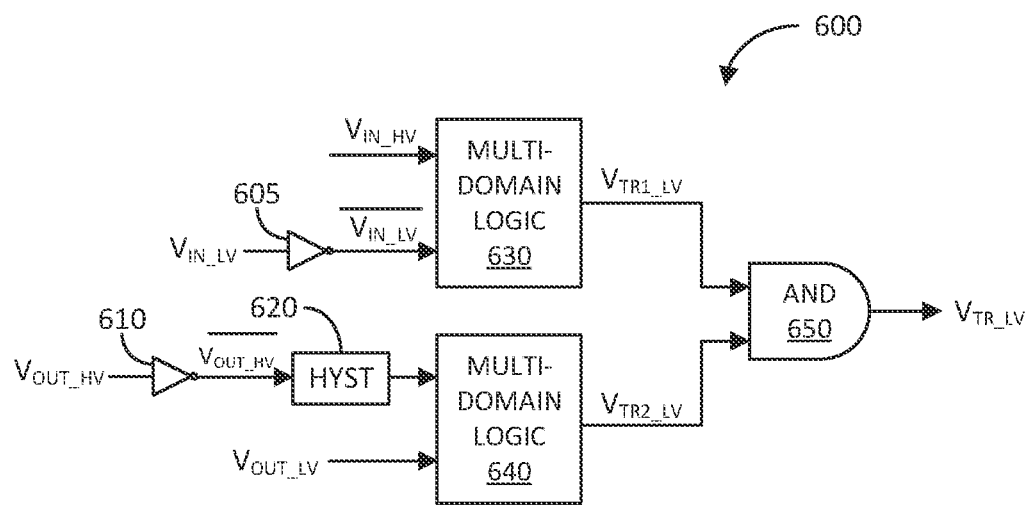
FIG. 6 illustrates a block diagram of an example pull-up gate boost control circuit in accordance with another aspect of the disclosure.

FIG. 6 illustrates a block diagram of an example pull-up gate boost control circuit 600 in accordance with another aspect of the disclosure. The pull-up gate boost control circuit 600 may be an example detailed implementation of the pull-up side or portion of the gate boost control circuit 320 previously discussed. That is, the pull-up gate boost control circuit 600 is configured to generate the pull-up gate boosting enable signal $V_{TR\_LV}$ based on the input signals $V_{IN\_HV}$ and $V_{IN\_LV}$, and the output signals $V_{OUT\_HV}$ and $V_{OUT\_LV}$. As previously discussed, the pull-up gate boost control circuit 600 generates the gate boosting enable signal $V_{TR\_LV}$ at an asserted high logic voltage VDDPX (e.g., 1.8V) during a rising transition interval (e.g., 80% thereof) of the output signal $V_{OUT}$, and at a deasserted low logic voltage VSSIX (e.g., 0.9V) during the steady-state and falling transition intervals.

In particular, the pull-up gate boost control circuit 600 includes first and second inverters 605 and 610, a hysteresis logic device 620, a first multi-domain logic circuit 630, a second multi-domain logic circuit 640, and a logic gate 650 (e.g., an AND gate). The first inverter 605 is configured to receive and invert the input signal $V_{IN\_LV}$ to generate a complementary input signal $\overline{V_{IN\_LV}}$. The second inverter 610 is configured to receive and invert the output signal $V_{OUT\_HV}$ to generate a complementary output signal $\overline{V_{OUT\_HV}}$.

The first multi-domain logic circuit 630 is configured to receive the input signal $V_{IN\_HV}$ and the complementary input signal $\overline{V_{IN\_LV}}$, and generate a pull-up gate boosting initiating signal $V_{TR1\_LV}$ in the LV voltage domain. The second multi-domain logic circuit 640 is configured to receive the complementary output signal $\overline{V_{OUT\_HV}}$ and the output signal $V_{OUT\_LV}$, and generate therefrom a pull-up gate boosting terminating signal $V_{TR2\_LV}$ in the LV voltage domain. The second multi-domain logic circuit 640 may be configured to receive the complementary output signal $\overline{V_{OUT\_HV}}$ via the hysteresis logic device 620. Similarly, the hysteresis logic device 620 has two switching thresholds: an upper threshold where the hysteresis logic device 620 generates a high logic voltage upon the signal $\overline{V_{OUT\_HV}}$ rising above the upper threshold, and a lower threshold where the hysteresis logic device 620 generates a low logic voltage upon the signal $\overline{V_{OUT\_HV}}$ falling below the lower threshold. This is done so that the pull-up gate boosting terminating signal $V_{TR2\_LV}$ changes in response to a higher voltage of $\overline{V_{OUT\_HV}}$. This has the effect of delaying the termination of the gate boosting interval. The AND gate 650 logically ANDs the gate boosting initiating and terminating signals $V_{TR1\_LV}$ and $V_{TR2\_LV}$ to generate the pull-up gate boosting enable signal $V_{TR\_LV}$ in the LV voltage domain.

As previously discussed, the input signal $V_{IN}$ initiates the pull-up gate boosting interval and the output signal $V_{OUT}$ terminates the pull-up gate boosting interval. Prior to the rising transition, the input and output signals $V_{IN}$ and $V_{OUT}$ are at low logic steady-states. In response to the input signal $V_{IN}$ being logically low, the voltage level shifter 310 generates the input signals $V_{IN\_HV}$ and $V_{IN\_LV}$ logically low VSSIX (e.g., 0.9V) and VSSX (e.g., 0V), respectively. Similarly, in response to the output signal $V_{OUT}$ being logically low, the voltage domain splitter 460 generates the output signals $V_{OUT\_HV}$ and $V_{OUT\_LV}$ logically low VSSIX (e.g., 0.9V) and VSSX (e.g., 0V).

The first multi-domain logic circuit 630 inverts the signal $\overline{V_{IN\_LV}}$ to generate the pull-up gate boosting initiating signal $V_{TR1\_LV}$. As the signal $\overline{V_{IN\_LV}}$ is logically high, the pull-up gate boosting initiating signal $V_{TR1\_LV}$ is logically low. Similarly, the second multi-domain logic circuit 640 inverts the signal $V_{OUT\_LV}$ to generate the pull-up gate boosting terminating signal $V_{TR2\_LV}$. As the signal $V_{OUT\_LV}$ is logically low, the pull-up gate boosting terminating signal $V_{TR1\_LV}$ is logically high. As the AND gate 650 sees logically low and high input signals $V_{TR\_LV}$ and $V_{TR2\_LV}$, the AND gate 650 generates the pull-up gate boosting enable signal $V_{TR\_LV}$ in its deasserted low logic state VSSX (e.g., 0V), as the output signal $V_{OUT}$ is at a steady-state low VSSX.

When the input signal $V_{IN}$ subsequently transitions to a high logic state, the voltage level shifter 310 generates the input signals $V_{IN\_HV}$ and $\overline{V_{IN\_LV}}$ at logically high VDDPX (e.g., 1.8V) and logically low VSSX (e.g., 0V) states, respectively. In response, the first multi-domain logic circuit 630 inverts the low logic signal $\overline{V_{IN\_LV}}$ to generate the pull-up gate boosting initiating signal $V_{TR1\_LV}$ as an asserted high logic voltage VDDIX (e.g., 0.9V). As the AND gate 650 now sees logically high input signals $V_{TR1\_LV}$ and $V_{TR2\_LV}$, the AND gate 650 generates the pull-up gate boosting enable signal $V_{TR\_LV}$ in the asserted high logic level VDDIX (e.g., 0.9V) to initiate the pull-up gate boosting interval. As previously mentioned, the pull-up gate boosting interval is initiated in response to the input signal $V_{IN}$ transitioning to a high logic state.

When the output signal $V_{OUT}$ substantially transitions to a high logic state, the voltage domain splitter 360 generates the output signals $V_{OUT\_HV}$ and $V_{OUT\_LV}$ at high logic states VDDPX (e.g., 1.8V) and VDDIX (e.g., 0.9V), respectively. In response, the second multi-domain logic circuit 640 inverts the high logic signal $V_{OUT\_LV}$ to generate the pull-up gate boosting terminating signal $V_{TR2\_LV}$ as an asserted high logic voltage VDDIX (e.g., 0.9V). As the AND gate 650 now sees logically high and low input signals $V_{TR1\_LV}$ and $V_{TR\_LV}$, the AND gate 650 generates the pull-up gate boosting enable signal $V_{TR\_LV}$ in its deasserted low logic state VSSX (e.g., 0V) to terminate the pull-up gate boosting interval. As previously mentioned, the pull-up gate boosting interval is terminated in response to the output signal $V_{OUT}$ transitioning to a high logic state.

Figure 7:
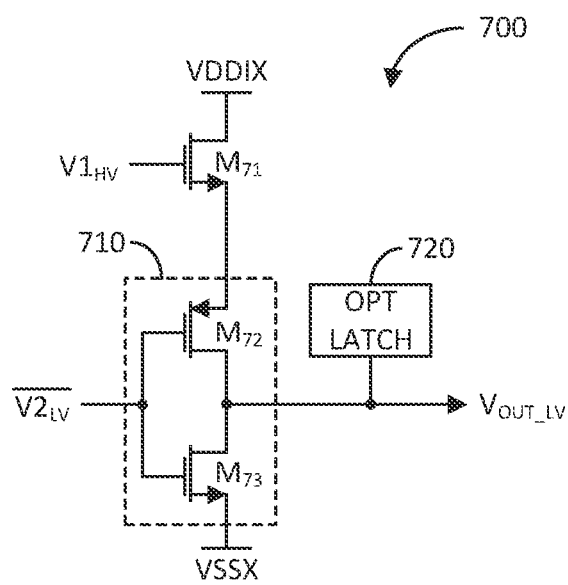
FIG. 7 illustrates a schematic diagram of an example multi-domain logic circuit of the pull-up gate boost control circuit of FIG. 6 in accordance with another aspect of the disclosure.

FIG. 7 illustrates a block diagram of an example multi-domain logic circuit 700 in accordance with another aspect of the disclosure. The multi-domain logic circuit 700 includes a first FET $M_{71}$, which may be implemented as NMOS FET. The multi-domain logic circuit 700 further includes an inverter 710 including a second FET $M_{72}$ and a third FET $M_{73}$. The second FET $M_{72}$ may be implemented as a PMOS FET, and the third FET $M_{73}$ may be implemented as an NMOS FET. The NMOS FET $M_{71}$ and the inverter 710 are coupled in series between an upper voltage rail VDDIX and a lower voltage rail VSSX (e.g., associated with the LV voltage domain).

The NMOS FET $M_{71}$ includes a gate configured to receive a signal $V1_{HV}$. With reference to the pull-up gate boost control circuit 600, the signal $V1_{HV}$ may be the input signal $V_{IN\_HV}$ if the multi-domain logic circuit 700 corresponds to the first multi-domain logic circuit 630, or the output signal $\overline{V_{OUT\_HV}}$ if the multi-domain logic circuit 700 corresponds to the second multi-domain logic circuit 640.

The PMOS FET $M_{72}$ and the NMOS FET $M_{73}$ include respective gates coupled together to form an input of the inverter 710, and configured to receive the complementary signal $\overline{V2_{LV}}$. With reference to the pull-up gate boost control circuit 600, the complementary signal $\overline{V2_{LV}}$ may be the complementary input signal $\overline{V_{IN\_LV}}$ if the multi-domain logic circuit 700 corresponds to the first multi-domain logic circuit 630, or the output signal $V_{OUT\_LV}$ if the multi-domain logic circuit 700 corresponds to the second multi-domain logic circuit 640.

The PMOS FET $M_{72}$ and the NMOS FET $M_{73}$ include respective drains coupled together to form an output of the inverter 710, and configured to generate the output signal $V_{OUT\_LV}$. With reference to the pull-up gate boost control circuit 600, the output signal $V_{OUT\_LV}$ may be the pull-up gate boosting initiating signal $V_{TR1\_LV}$ if the multi-domain logic circuit 700 corresponds to the first multi-domain logic circuit 630, or the pull-up gate boosting terminating signal $V_{TR2\_LV}$ if the multi-domain logic circuit 700 corresponds to the second multi-domain logic circuit 640. The multi-domain logic circuit 700 may optionally include a latch 720 (e.g., cross-coupled inverters) configured to latch the logic state of the $V_{OUT\_LV}$.

Figure 8:
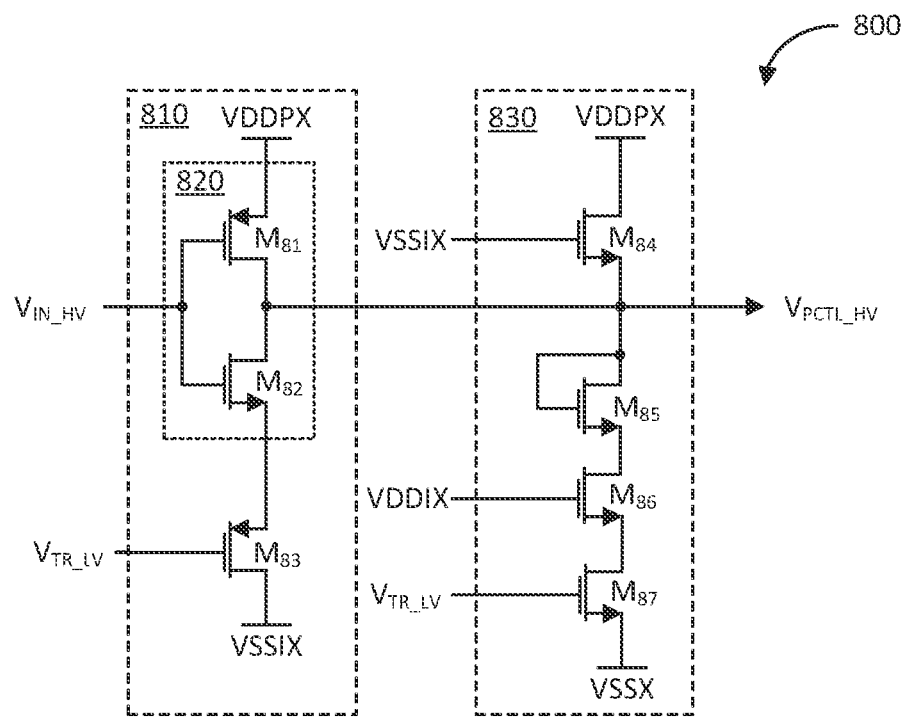
FIG. 8 illustrates a schematic diagram of an example first pull-up predriver in accordance with another aspect of the disclosure.

FIG. 8 illustrates a schematic diagram of an example first pull-up predriver 800 in accordance with another aspect of the disclosure. The first pull-up predriver 800 may be the portion of the steady-state and transition predrivers 330 and 340 that generates the control signal $V_{PCTL\_HV}$ for the PMOS FET $M_{21}$ of output driver 350. The first pull-up predriver 800 includes a first steady-state pull-up predriver 810 and a first pull-up transition predriver 830.

The first steady-state pull-up predriver 810 includes an inverter 820 coupled in series with a PMOS FET $M_{83}$ between the upper voltage rail VDDPX and the lower voltage rail VSSIX associated with the HV voltage domain. The inverter 820, in turn, includes a PMOS FET $M_{81}$ and an NMOS FET $M_{82}$. The PMOS FET $M_{81}$ and the NMOS FET $M_{82}$ include gates coupled together to form an input of the inverter 820. The input of the inverter 820 is configured to receive the input signal $V_{IN\_HV}$ in the HV voltage domain. The PMOS FET $M_{81}$ and the NMOS FET $M_{82}$ include drains coupled together to form an output of the inverter 820, which also serves as the output of the first pull-up predriver 800, and is coupled to the gate of PMOS FET $M_{21}$. During the steady-state high and low, and the falling transition of the output signal $V_{OUT}$, the inverter 820 is configured to generate the control signal $V_{PCTL\_HV}$ for the PMOS FET $M_{21}$ of the output driver 350. The PMOS FET $M_{83}$ includes a gate configured to receive the pull-up gate boosting enable signal $V_{TR\_LV}$.

The first pull-up transition predriver 830 includes an NMOS FET $M_{84}$ coupled between the upper voltage rail VDDPX and the output of the first pull-up predriver 800. The first pull-up transition predriver 830 further includes a diode-connected NMOS FET $M_{85}$, an NMOS FET $M_{86}$, and another NMOS FET $M_{87}$ coupled in series between the output of the first pull-up predriver 800 and the lower voltage rail VSSX. The NMOS FET $M_{84}$ includes a gate configured to receive a bias voltage VSSIX (e.g., 0.9V). The NMOS FET $M_{85}$ is diode-connected because its drain and gate are coupled together. The NMOS FET $M_{86}$ includes a gate configured to receive a bias voltage VDDIX (e.g., 0.9V). The NMOS FET $M_{57}$ includes a gate configured to receive the pull-up gate boosting enable signal $V_{TR\_LV}$.

With further reference to FIG. 3B, the operation of the first pull-up predriver 800 is as follows: The control signal $V_{PCTL\_HV}$ is in a low logic state VSSIX (e.g., 0.9V) when the output signal $V_{OUT}$ is at a steady-state high logic state VDDPX (e.g., 1.8V). When the output signal $V_{OUT}$ is at the steady-state high logic state VDDPX (e.g., 1.8V), the input signal $V_{IN\_HV}$ is at a high logic state VDDPX (e.g., 1.8V), and the pull-up gate boosting enable signal $V_{TR\_LV}$ is in the deasserted low logic state VSSX (e.g., 0V). As such, the PMOS FET $M_{83}$ is turned on to enable the inverter 820, and the inverter 820 inverts the high logic state VDDPX (e.g., 1.8V) of the input signal $V_{IN\_HV}$ to generate the control signal $V_{PCTL\_HV}$ at the low logic state VSSIX (e.g., 0.9V). During this steady-state, the first pull-up transition predriver 830 is disabled because the low logic state VSSX (e.g., 0V) of the pull-up gate boosting enable signal $V_{TR\_LV}$ maintains NMOS FET $M_{87}$ turned off.

The control signal $V_{PCTL\_HV}$ is in a high logic state VDDPX (e.g., 1.8V) when the output signal $V_{OUT}$ is at a steady-state low logic state VSSX (e.g., 0V). When the output signal $V_{OUT}$ is at the steady-state low logic state VSSX (e.g., 0V), the input signal $V_{IN\_HV}$ is at a low logic state VSSX (e.g., 0V), and the pull-up gate boosting enable signal $V_{TR\_LV}$ is in the deasserted low logic state VSSX (e.g., 0V). As such, the PMOS FET $M_{83}$ is turned on to enable the inverter 820, and the inverter 820 inverts the low logic state VSSX (e.g., 0V) of the input signal $V_{IN\_HV}$ to generate the control signal $V_{PCTL\_HV}$ at the high logic state VDDPX (e.g., 1.8V). Similarly, during this steady-state, the first pull-up transition predriver 830 is disabled because the low logic state VSSX (e.g., 0V) of the pull-up gate boosting enable signal $V_{TR\_LV}$ maintains NMOS FET $M_{87}$ turned off.

The control signal $V_{PCTL\_HV}$ is in a high logic state VDDPX (e.g., 1.8V) when the output signal $V_{OUT}$ is transitioning from a high logic state VDDPX (e.g., 1.8V) to a low logic state VSSX (e.g., 0V). When the output signal $V_{OUT}$ is transitioning to the low logic state VSSX (e.g., 0V), the input signal $V_{IN\_HV}$ is at a low logic state VSSX (e.g., 0.9V), and the pull-up gate boosting enable signal $V_{TR\_LV}$ is in the deasserted low logic state VSSX (e.g., 0V). As such, the PMOS FET $M_{83}$ is turned on to enable the inverter 820, the inverter 820 inverts the low logic state VSSX (e.g., 0V) of the input signal $V_{IN\_HV}$ to generate the control signal $V_{PCTL\_HV}$ at the high logic state VDDPX (e.g., 1.8V). During this high-to-low transition interval, the first pull-up transition predriver 830 is disabled because the low logic state VSSX (e.g., 0V) of the pull-up gate boosting enable signal $V_{TR\_LV}$ maintains NMOS FET $M_{87}$ turned off.

The control signal $V_{PCTL\_HV}$ is in a boosted state (e.g., ~0.4V) when the output signal $V_{OUT}$ is transitioning from a low logic state VSSX (e.g., 0V) to a high logic state VDDPX (e.g., 1.8V). When the output signal $V_{OUT}$ is transitioning to the high logic state VDDPX (e.g., 1.8V), the input signal $V_{IN\_HV}$ is at a high logic state VDDPX (e.g., 1.8V), and the pull-up gate boosting enable signal $V_{TR\_LV}$ is in the asserted high logic state VDDIX (e.g., 0.9V). As such, the PMOS FET $M_{83}$ is turned off to disable the first steady-state pull-up predriver 810. The pull-up gate boosting enable signal $V_{TR\_LV}$ being in the enabled high logic state VDDIX (e.g., 0.9V) turns on NMOS FET $M_{87}$ to produce a current path between VDDPX and VSSX. The turning on of NMOS FET $M_{87}$ also causes NMOS FET M86 to turn on. Thus, the diode-connected NMOS FET $M_{85}$ is coupled between the output of the first pull-up predriver 800 and the lower voltage rail VSSX; thereby generating the control signal $V_{PCTL\_HV}$ at the boosted voltage level of about 0.4V (e.g., the voltage drop across the diode-connected NMOS FET $M_{85}$). The top NMOS FET $M_{84}$ is configured to limit the current between VDDPX and VSSX.

Figure 9:
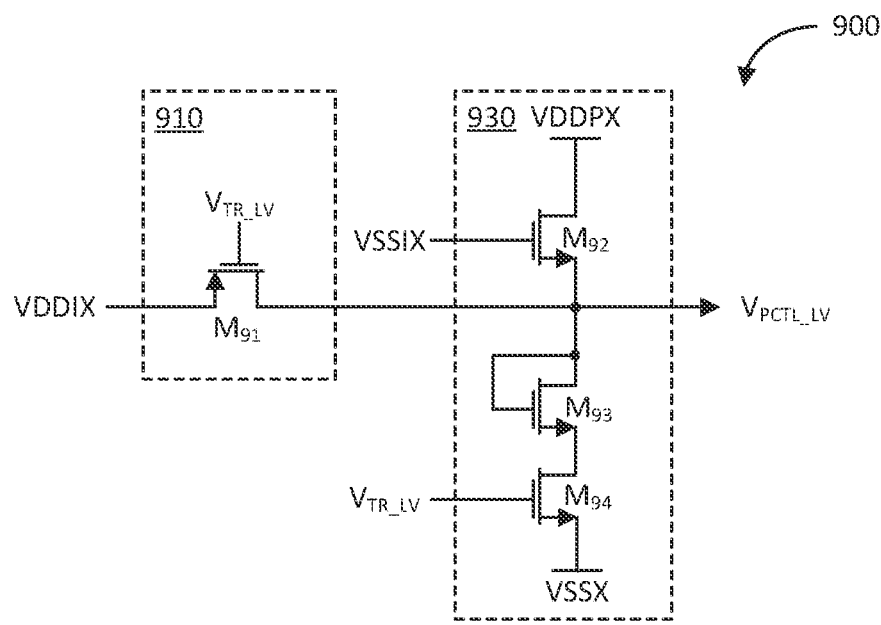
FIG. 9 illustrates a schematic diagram of an example second pull-up predriver in accordance with another aspect of the disclosure.

FIG. 9 illustrates a schematic diagram of an example second pull-up predriver 900 in accordance with another aspect of the disclosure. The second pull-up predriver 900 may be the portion of the steady-state and transition predrivers 330 and 340 that generates the control signal $V_{PCTL\_LV}$ for the PMOS FET $M_{22}$ of output driver 350. The second pull-up predriver 900 includes a second steady-state pull-up predriver 910 and a second pull-up transition predriver 930.

The second steady-state pull-up predriver 910 includes a PMOS FET $M_{91}$ including a source configured to receive a bias voltage VDDIX (e.g., 0.9V), a gate configured to receive the pull-up gate boosting enable signal $V_{TR\_LV}$, and a drain serving as the output of the second pull-up predriver 900 to generate the control signal $V_{PCTL\_LV}$ for the PMOS FET $M_{22}$ of the output driver 350 (the output of the second pull-up predriver 900 being coupled to the gate of PMOS FET $M_{22}$).

The second pull-up transition predriver 930 includes an NMOS FET $M_{92}$ coupled between the upper voltage rail VDDPX and the output of the second pull-up predriver 900. The second pull-up transition predriver 930 further includes a diode-connected NMOS FET $M_{93}$ coupled in series with an NMOS FET $M_{94}$ between the output of the second pull-up predriver 900 and the lower voltage rail VSSX. The NMOS FET $M_{92}$ includes a gate configured to receive a bias voltage VSSIX (e.g., 0.9V). The NMOS FET $M_{93}$ is diode-connected because its drain and gate are coupled together. The NMOS FET $M_{94}$ includes a gate configured to receive the pull-up gate boosting enable signal $V_{TR\_LV}$.

With further reference to FIG. 3B, the operation of the second pull-up predriver 900 is as follows: The control signal $V_{PCTL\_LV}$ is in a non-boosted state (e.g., 0.9V) when the output signal $V_{OUT}$, is in the steady-state high logic state VDDPX (e.g., 1.8V), the steady-state low logic state VSSX (e.g., 0V), or transitioning from high-to-low. When the output signal $V_{OUT}$ is at the aforementioned states, the pull-up gate boosting enable signal $V_{TR\_LV}$ is in the deasserted low logic state VSSX (e.g., 0V). As such, the PMOS FET $M_{91}$ is turned on to output its source voltage VDDIX (e.g., 0.9V) as the control signal $V_{PCTL\_LV}$. During these states, the second pull-up transition predriver 930 is disabled because the low logic state VSSX (e.g., 0V) of the pull-up gate boosting enable signal $V_{TR\_LV}$ maintains NMOS FET $M_{94}$ turned off.

The control signal $V_{PCTL\_LV}$ is in a boosted state (e.g., ~0.4V) when the output signal $V_{OUT}$ is transitioning from a low logic state VSSX (e.g., 0V) to a high logic state VDDPX (e.g., 1.8V). When the output signal Vou-r is transitioning to the high logic state VDDPX (e.g., 1.8V), the pull-up gate boosting enable signal $V_{TR\_LV}$ is in the asserted high logic state VDDIX (e.g., 0.9V). As such, the PMOS FET $M_{91}$ is turned off to disable the second steady-state pull-up predriver 910. The pull-up gate boosting enable signal $V_{TR\_LV}$ being in the asserted high logic state VDDIX (e.g., 0.9V) turns on NMOS FET $M_{94}$ to produce a current path between VDDPX and VSSX. Thus, the diode-connected NMOS FET $M_{93}$ is coupled between the output of the second pull-up predriver 900 and the lower voltage rail VSSX; thereby generating the control signal $V_{PCTL\_LV}$ at the boosted voltage level ~0.4V (e.g., the voltage drop across the diode-connected NMOS FET $M_{93}$). The top NMOS FET $M_{92}$ is configured to limit the current between VDDPX and VSSX.

Figure 10:
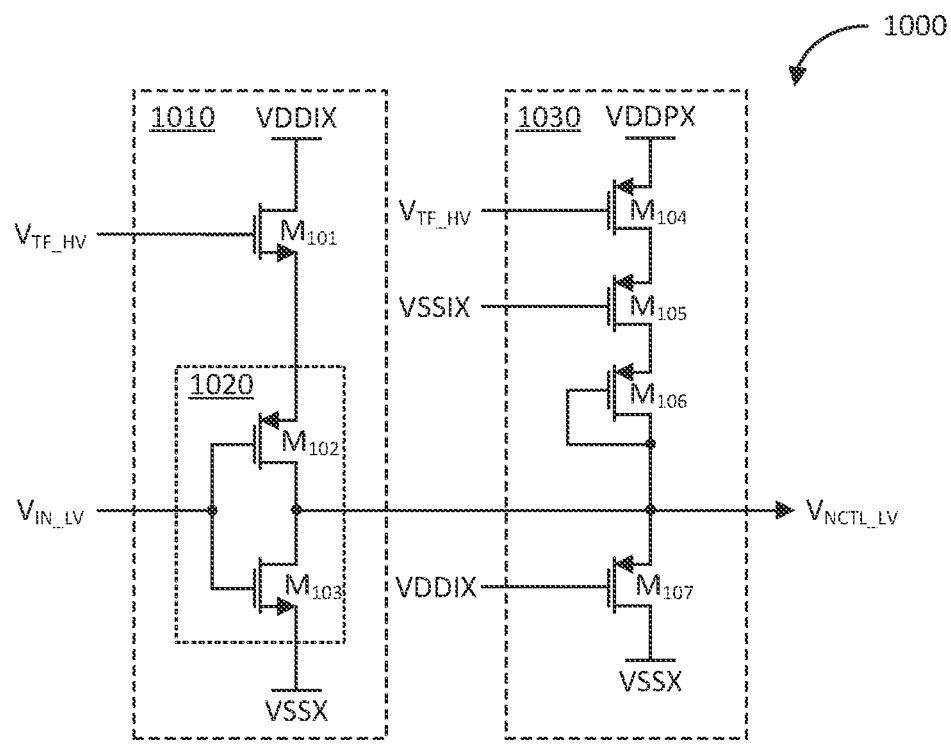
FIG. 10 illustrates a schematic diagram of an example first pull-down predriver in accordance with another aspect of the disclosure.

FIG. 10 illustrates a schematic diagram of an example first pull-down predriver 1000 in accordance with another aspect of the disclosure. The first pull-down predriver 1000 may be the portion of the steady-state and transition predrivers 330 and 340 that generates the control signal $V_{NCTL\_LV}$ for the NMOS FET $M_{24}$ of output driver 350. The first pull-down predriver 1000 includes a first steady-state pull-down predriver 1010 and a first pull-down transition predriver 1030.

The first steady-state pull-down predriver 1010 includes an NMOS FET $M_{101}$ coupled in series with an inverter 1020 between the upper voltage rail VDDIX and the lower voltage rail VSSX associated with the LV voltage domain. The NMOS FET $M_{101}$ includes a gate configured to receive the pull-down gate boosting enable signal $V_{TF\_HV}$. The inverter 1020, in turn, includes a PMOS FET $M_{102}$ and an NMOS FET $M_{103}$. The PMOS FET $M_{102}$ and the NMOS FET $M_{103}$ include gates coupled together to form an input of the inverter 1020. The input of the inverter 1020 is configured to receive the input signal $V_{IN\_LV}$ in the LV voltage domain. The PMOS FET $M_{102}$ and the NMOS FET $M_{103}$ include drains coupled together to form an output of the inverter 1020, which also serves as the output of the first pull-down predriver 1000, and is coupled to the gate of NMOS FET $M_{24}$. During steady-state high and low, and the rising transition of the output signal $V_{OUT}$, the inverter 1020 is configured to generate the control signal $V_{NCTL\_LV}$ for the NMOS FET $M_{24}$ of the output driver 350.

The first pull-down transition predriver 1030 includes a first PMOS FET $M_{104}$, a second PMOS FET $M_{105}$, and a diode-connected PMOS FET $M_{105}$ coupled in series between the upper voltage rail VDDPX and the output of the first pull-down predriver 1000. The first pull-down transition predriver 1030 further includes a third PMOS FET $M_{107}$ coupled between the output of the first pull-down predriver 1000 and the lower voltage rail VSSX. The PMOS FET $M_{104}$ includes a gate configured to receive the pull-down gate boosting enable signal $V_{TF\_HV}$. The PMOS FET $M_{105}$ includes a gate configured to receive a bias voltage VSSIX (e.g., 0.9V). The PMOS FET $M_{106}$ is diode-connected because its drain and gate are coupled together. The PMOS FET $M_{107}$ includes a gate configured to receive a bias voltage VDDIX (e.g., 0.9V).

With further reference to FIG. 3B, the operation of the first pull-down predriver 1000 is as follows: The control signal $V_{NCTL\_LV}$ is in a high logic state VDDIX (e.g., 0.9V) when the output signal $V_{OUT}$ is at a steady-state low logic state VSSX (e.g., 0V). When the output signal $V_{OUT}$ is at the steady-state low logic state VSSX (e.g., 0V), the input signal $V_{IN\_LV}$ is at a low logic state VSSX (e.g., 0V), and the pull-down gate boosting enable signal $V_{TF\_HV}$ is in the deasserted high logic state VDDPX (e.g., 1.8V). As such, the NMOS FET $M_{101}$ is turned on to enable the inverter 1020, and the inverter 1020 inverts the low logic state VSSX (e.g., 0V) of the input signal $V_{IN\_LV}$ to generate the control signal $V_{NCTL\_LV}$ at the high logic state VDDIX (e.g., 0.9V). During this steady-state, the first pull-down transition predriver 1030 is disabled because the deasserted high logic state VDDPX (e.g., 1.8V) of the pull-down gate boosting enable signal $V_{TF\_HV}$ maintains the PMOS FET $M_{104}$ turned off.

The control signal $V_{NCTL\_LV}$ is in a low logic state VSSX (e.g., 0V) when the output signal $V_{OUT}$ is at a steady-state high logic state VDDPX (e.g., 1.8V). When the output signal $V_{OUT}$ is at the steady-state high logic state VDDPX (e.g., 1.8V), the input signal $V_{IN\_LV}$ is at a high logic state VDDIX (e.g., 0.9V), and the pull-down gate boosting enable signal $V_{TF\_HV}$ is in the deasserted high logic state VDDPX (e.g., 1.8V). As such, the NMOS FET $M_{101}$ is turned on to enable the inverter 1020, and the inverter 1020 inverts the high logic state VDDIX (e.g., 0.9V) of the input signal $V_{IN\_LV}$ to generate the control signal $V_{NCTL\_LV}$ at the low logic state VSSX (e.g., 0V). Similarly, during this steady-state, the first pull-down transition predriver 1030 is disabled because the deasserted high logic state VDDPX (e.g., 1.8V) of the pull-down gate boosting enable signal $V_{TF\_HV}$ maintains PMOS FET $M_{104}$ turned off.

The control signal $V_{NCTL\_LV}$ is in a low logic state VSSX (e.g., 0V) when the output signal Vou-r is transitioning from a low logic state VSSX (e.g., 0V) to a high logic state VDDPX (e.g., 1.8V). When the output signal $V_{OUT}$ is transitioning to the high logic state VDDPX (e.g., 1.8V), the input signal $V_{IN\_LV}$ is at a high logic state VDDIX (e.g., 0.9V), and the pull-down gate boosting enable signal $V_{TF\_HV}$ is in the deasserted high logic state VDDPX (e.g., 1.8V). As such, the NMOS FET $M_{101}$ is turned on to enable the inverter 1020, and the inverter 1020 inverts the high logic state VDDIX (e.g., 0.9V) of the input signal $V_{IN\_LV}$ to generate the control signal $V_{NCTL\_LV}$ at the low logic state VSSX (e.g., 0V). During this low-to-high transition interval, the first pull-down transition predriver 1030 is disabled because the deasserted high logic state VDDPX (e.g., 1.8V) of the pull-down gate boosting enable signal $V_{TF\_HV}$ maintains NMOS FET $M_{104}$ turned off.

The control signal $V_{NCTL\_LV}$ is in a boosted state (e.g., ~1.4V) when the output signal $V_{OUT}$ is transitioning from a high logic state VDDPX (e.g., 1.8V) to a low logic state VSSX (e.g., 0V). When the output signal $V_{OUT}$ is transitioning to the low logic state VSSX (e.g., 0V), the input signal $V_{IN\_LV}$ is at a low logic state VSSX (e.g., 0V), and the pull-down gate boosting enable signal $V_{TF\_HV}$ is in the asserted low logic state VSSIX (e.g., 0.9V). As such, the NMOS FET $M_{101}$ is turned off to disable the first steady-state pull-down predriver 1010. The pull-down gate boosting enable signal $V_{TF\_HV}$ being in the asserted low logic state VSSIX (e.g., 0.9V) turns on PMOS FET $M_{104}$ to produce a current path between VDDPX and VSSX. The turning on of PMOS FET $M_{104}$ also causes PMOS FET $M_{105}$ to turn on. Thus, the diode-connected PMOS FET $M_{106}$ is coupled between the upper voltage rail VDDPX and output of the first pull-down predriver 1000; thereby generating the control signal $V_{NCTL\_LV}$ at the boosted voltage level of about ~1.4V (e.g., a diode voltage drop below the VDDPX (e.g., 1.8V)). The bottom PMOS FET $M_{107}$ is configured to limit the current between VDDPX and VSSX.

Figure 11:
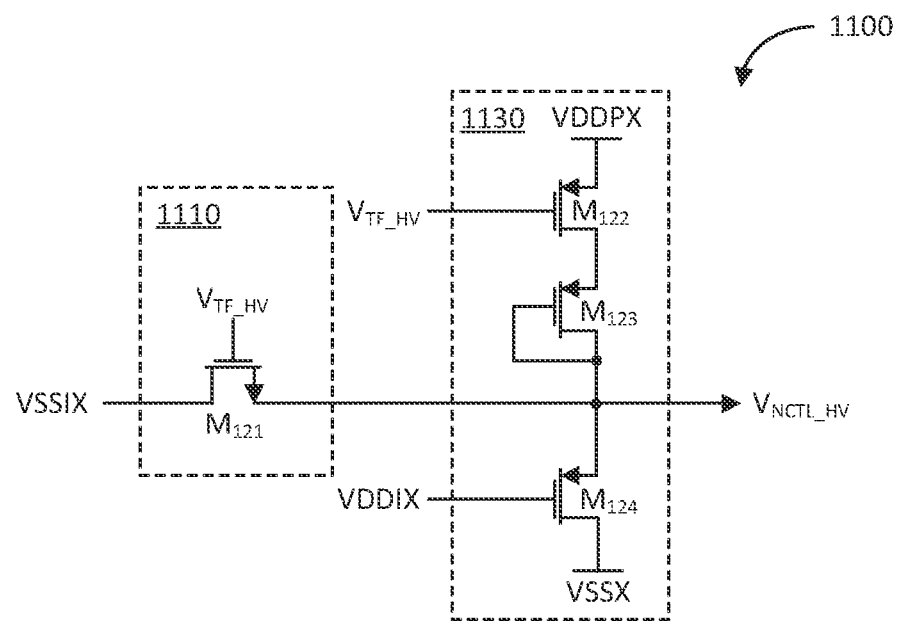
FIG. 11 illustrates a schematic diagram of an example second pull-down predriver in accordance with another aspect of the disclosure.

FIG. 11 illustrates a schematic diagram of an example second pull-down predriver 1100 in accordance with another aspect of the disclosure. The second pull-down predriver 1100 may be the portion of the steady-state and transition predrivers 330 and 340 that generates the control signal $V_{NCTL\_HV}$ for the NMOS FET $M_{23}$ of output driver 350. The second pull-down predriver 1100 includes a second steady-state pull-down predriver 1110 and a second pull-down transition predriver 1130.

The second steady-state pull-down predriver 1110 includes an NMOS FET $M_{121}$ including a drain configured to receive a bias voltage VSSIX (e.g., 0.9V), a gate configured to receive the pull-down gate boosting enable signal $V_{TF\_HV}$, and a drain serving as the output of the second pull-down predriver 1100 to generate the control signal $V_{NCTL\_HV}$ for the NMOS FET $M_{23}$ of the output driver 350 (the output of the second pull-down predriver 1100 being coupled to the gate of NMOS FET $M_{23}$).

The second pull-down transition predriver 1130 includes a PMOS FET $M_{122}$ coupled in series with a diode-connected PMOS FET $M_{123}$ between the upper voltage rail VDDPX and the output of the second pull-down predriver 1100. The second pull-down transition predriver 1130 further includes a PMOS FET $M_{124}$ coupled between the output of the second pull-down predriver 1100 and the lower voltage rail VSSX. The PMOS FET $M_{122}$ includes a gate configured to receive the pull-down gate boosting enable signal $V_{TF\_HV}$. The PMOS FET $M_{123}$ is diode-connected because its drain and gate are coupled together. The PMOS FET $M_{124}$ includes a gate configured to receive the high logic voltage VDDIX (e.g., 0.9V) of the LV voltage domain.

With further reference to FIG. 3B, the operation of the second pull-down predriver 1100 is as follows: The control signal $V_{NCTL\_HV}$ is in a non-boosted state (e.g., 0.9V) when the output signal $V_{OUT}$ is at the high and low steady-states VDDPX (e.g., 1.8V) and VSSX (e.g., 0V) or transitioning from low-to-high. When the output signal $V_{OUT}$ is in the aforementioned states, the pull-down gate boosting enable signal $V_{TF\_HV}$ is in the deasserted high logic state VDDPX (e.g., 1.8V). As such, the NMOS FET $M_{121}$ is turned on to output its drain voltage VSSIX (e.g., 0.9V) as the control signal $V_{NCTL\_HV}$. During these states, the second pull-down transition predriver 1130 is disabled because the deasserted high logic state VDDPX (e.g., 1.8V) of the pull-down gate boosting enable signal $V_{TF\_HV}$ maintains PMOS FET $M_{122}$ turned off.

The control signal $V_{NCTL\_HV}$ is in a boosted state (e.g., ~1.4V) when the output signal $V_{OUT}$ is transitioning from a high logic state VDDPX (e.g., 1.8V) to a low logic state VSSX (e.g., 0V). When the output signal Vou-r is transitioning to the low logic state VSSX (e.g., 0V), the pull-down gate boosting enable signal $V_{TF\_HV}$ is in the asserted low logic state VSSIX (e.g., 0.9V). As such, the NMOS FET $M_{121}$ is turned off to disable the second steady-state pull-down predriver 1110. The pull-down gate boosting enable signal $V_{TF\_HV}$ being in the asserted low logic state VSSIX (e.g., 0.9V) turns on PMOS FET $M_{122}$ to produce a current path between VDDPX and VSSX. Thus, the diode-connected PMOS FET $M_{123}$ is coupled between the upper voltage rail VDDPX and the output of the second pull-down predriver 1100; thereby generating the control signal $V_{NCTL\_HV}$ at the boosted voltage level ~1.4V (e.g., a diode voltage drop below VDDPX). The bottom PMOS FET $M_{124}$ is configured to limit the current between VDDPX and VSSX.

Figure 12:
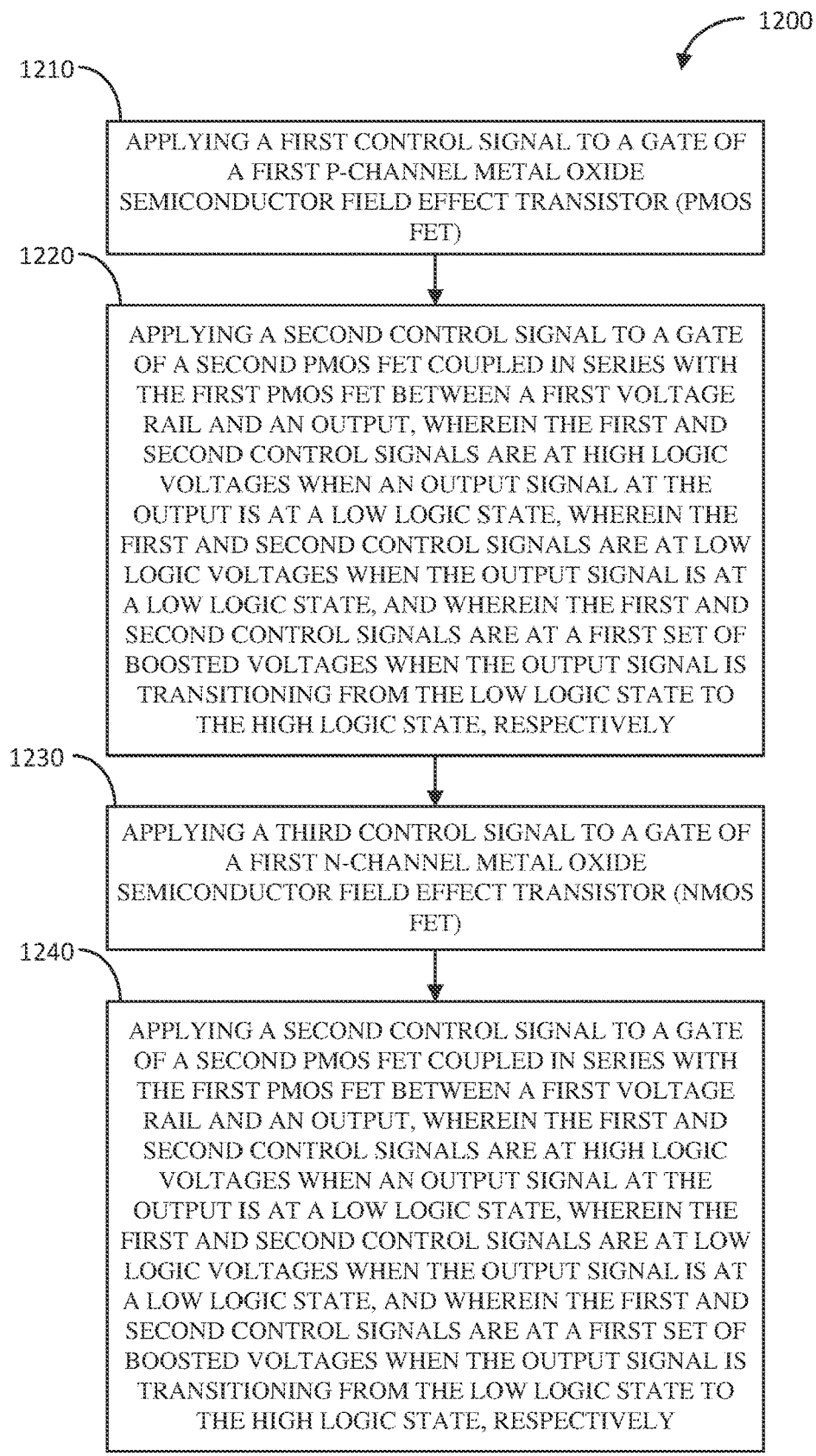
FIG. 12 illustrates a flow diagram of an example method of voltage level shifting an input signal to generate an output signal in accordance with another aspect of the disclosure.

FIG. 12 illustrates a flow diagram of an example method 1200 of voltage level shifting an input signal to generate an output signal in accordance with another aspect of the disclosure. The method includes applying a first control signal to a gate of a first p-channel metal oxide semiconductor field effect transistor (PMOS FET) (block 1210). Examples of means for applying a first control signal to a gate of a first p-channel metal oxide semiconductor field effect transistor (PMOS FET) include any of the pull-up steady-state or transition predrivers described herein.

The method 1200 further includes applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a low logic state, and wherein the first and second control signals are at a first set of boosted voltages when the output signal is transitioning from the low logic state to the high logic state, respectively (block 1220). Examples of means for applying a second control signal to a gate of a second PMOS FET include any of the pull-up steady-state or transition predrivers described herein.

The method 1200 additionally includes applying a third control signal to a gate of a first n-channel metal oxide semiconductor field effect transistor (NMOS FET) (block 1230). Examples of means for applying a third control signal to a gate of a first n-channel metal oxide semiconductor field effect transistor (NMOS FET) include any of the pull-down steady-state or transition predrivers described herein.

Further, the method 1200 includes applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively (block 1240). Examples of means for applying a fourth control signal to a gate of a second NMOS FET include any of the pull-down steady-state or transition predrivers described herein.

Figure 13:
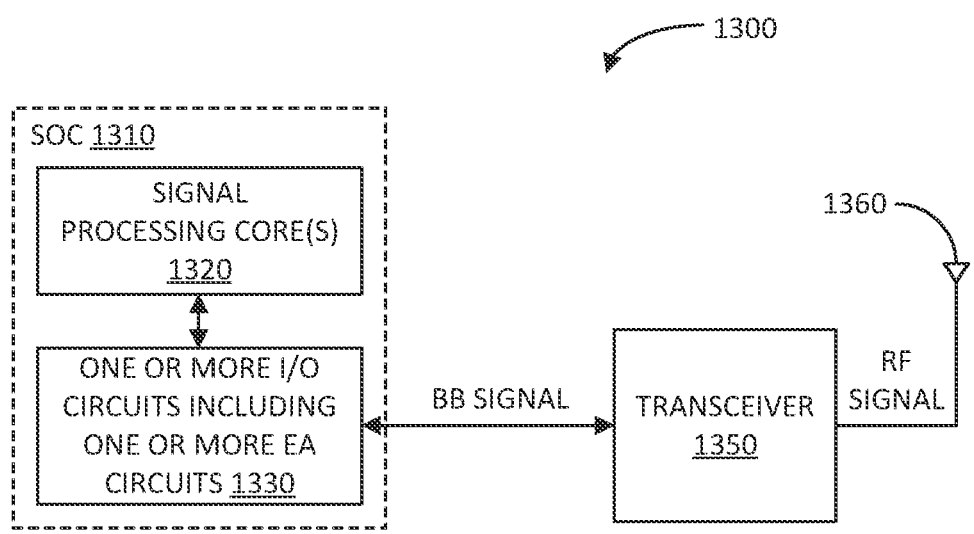
FIG. 13 illustrates a block diagram of an example wireless communication device in accordance with another aspect of the disclosure.

FIG. 13 illustrates a block diagram of an example wireless communication device 1300 in accordance with another aspect of the disclosure. The wireless communication device 1300 includes at least one antenna 1360 (e.g., at least one antenna array), a transceiver 1350 coupled to the at least one antenna 1360, and an integrated circuit (IC) or system on chip (SOC) 1310 coupled to the transceiver. The IC or SOC 1310, in turn, includes one or more signal processing cores 1320 and one or more input/output (I/O) circuits 1330. The one or more I/O circuit 1330 may be implemented per any of the I/O circuits described herein.

Pursuant to a signal transmission application, the one or more signal processing cores 1320 may be configured to process a transmit baseband (BB) signal in a first voltage domain (e.g., a CX voltage domain). The one or more I/O circuits 1330 may be configured to upwards voltage level shift the transmit (BB) baseband signal to a second voltage domain (e.g., a PX voltage domain). The transmit baseband (BB) signal in the second voltage domain is provided to the transceiver 1350, which is configured to generate a transmit radio frequency (RF) signal based on the transmit baseband (BB) signal. The transmit RF signal is provided to the at least one antenna 1360 for wireless transmission to one or more remote wireless devices.

It shall be understood that inverters and logic gates (e.g., AND, NAND, etc.) described herein can be implemented with different configurations of transistors and/or combination of logic gates. For example, an inverter can be implemented using a NAND gate.

The following provides an overview of aspects of the present disclosure:

Aspect 1: An apparatus, including: an output driver, including: a first p-channel metal oxide semiconductor field effect transistor (PMOS FET); a second PMOS FET coupled in series with the first PMOS FET between a first voltage rail and an output; a first n-channel metal oxide semiconductor field effect transistor (NMOS FET); and a second NMOS FET coupled in series with the first NMOS FET between the output and a second voltage rail; a first predriver coupled to gates of the first and second PMOS FETs and first and second NMOS FETs; and a second predriver coupled to the gates of the first and second PMOS FETs and first and second NMOS FETs.

Aspect 2: The apparatus of aspect 1, wherein the first predriver includes a pull-up predriver coupled to the gate of the first PMOS FET.

Aspect 3: The apparatus of aspect 2, wherein the pull-up predriver includes: an inverter including an input configured to receive an input signal, and an output coupled to the gate of the first PMOS FET; and a third PMOS FET coupled in series with the inverter between the first voltage rail and a third voltage rail, wherein the third PMOS FET is configured to receive a pull-up gate boosting enable signal.

Aspect 4: The apparatus of any one of aspects 1-3, wherein the second predriver includes a pull-up predriver coupled to the gate of the first PMOS FET.

Aspect 5: The apparatus of aspect 4, wherein the pull-up predriver includes: a third NMOS FET coupled between the first voltage rail and the gate of the first PMOS FET, wherein the third NMOS FET includes a gate configured to receive a first bias voltage; a diode-connected NMOS FET; a fourth NMOS FET including a gate configured to receive a second bias voltage; and a fifth NMOS FET coupled in series with the diode-connected NMOS FET and the fourth NMOS FET between the gate of the first PMOS FET and the second voltage rail, wherein the fifth NMOS FET includes a gate configured to receive a pull-up gate boosting enable signal.

Aspect 6: The apparatus of any one of aspect 1-5, wherein the first predriver includes a pull-up predriver coupled to the gate of the second PMOS FET.

Aspect 7: The apparatus of aspect 6, wherein the pull-up predriver includes a third PMOS FET including a source configured to receive a bias voltage, a gate configured to receive a pull-up gate boosting enable signal, and a drain coupled to the gate of the second PMOS FET.

Aspect 8: The apparatus of any one of aspects 1-7, wherein the second predriver includes a pull-up predriver coupled to the gate of the second PMOS FET.

Aspect 9: The apparatus of aspect 8, wherein the pull-up predriver includes: a third NMOS FET coupled between the first voltage rail and the gate of the second PMOS FET, wherein the third NMOS FET includes a gate configured to receive a bias voltage; a diode-connected NMOS FET; and a fourth NMOS FET coupled in series with the diode-connected NMOS FET between the gate of the second PMOS FET and the second voltage rail, wherein the fourth NMOS FET includes a gate configured to receive a pull-up gate boosting enable signal.

Aspect 10: The apparatus of any one of aspects 1-9, wherein the first predriver includes a pull-down predriver coupled to the gate of the second NMOS FET.

Aspect 11: The apparatus of aspect 10, wherein the pull-down predriver includes: a third NMOS FET including a gate configured to receive a pull-down gate boosting enable signal; and an inverter coupled in series with the third NMOS FET between a third voltage rail and the second voltage rail, wherein the inverter includes an input configured to receive an input signal, and an output coupled to the gate of the second NMOS FET.

Aspect 12: The apparatus of any one of aspects 1-11, wherein the second predriver includes a pull-down predriver coupled to the gate of the second NMOS FET.

Aspect 13: The apparatus of aspect 12, wherein the pull-down predriver includes: a third PMOS FET including a gate configured to receive a pull-down gate boosting enable signal; a fourth PMOS FET including a gate configured to receive a first bias voltage; a diode-connected PMOS FET coupled in series between the first voltage rail and the gate of the second NMOS FET; and a fourth PMOS FET including a gate configured to receive a second bias voltage.

Aspect 14: The apparatus of any one of aspects 1-13, wherein the first predriver includes a pull-down predriver coupled to the gate of the first NMOS FET.

Aspect 15: The apparatus of aspect 14, wherein the pull-down predriver includes a third NMOS FET including a drain configured to receive a bias voltage, a gate configured to receive a pull-down gate boosting enable signal, and a drain coupled to the gate of the first NMOS FET.

Aspect 16: The apparatus of any one of aspects 1-15, wherein the second predriver includes a pull-down predriver coupled to the gate of the first NMOS FET.

Aspect 17: The apparatus of aspect 16, wherein the pull-down predriver includes: a third PMOS FET including a gate configured to receive a pull-down gate boosting enable signal; a diode-connected PMOS FET coupled in series with the third PMOS FET between the first voltage rail and the gate of the first NMOS FET; and a fourth PMOS FET coupled between the gate of the first NMOS FET and the second voltage rail, wherein the fourth PMOS FET includes a gate configured to receive a bias voltage.

Aspect 18: The apparatus of any one of aspects 1-17, further including a gate boost control circuit coupled to the first predriver and the second predriver.

Aspect 19: The apparatus of aspect 18, wherein the gate boost control circuit includes a pull-up gate boost control circuit.

Aspect 20: The apparatus of aspect 19, wherein the pull-up gate boost control circuit includes: a first multi-domain logic circuit including first and second inputs configured to receive an input signal in a first voltage domain and a complementary input signal in a second voltage domain, respectively, and a first output configured to generate a pull-up gate boosting initiating signal in the second voltage domain; a second multi-domain logic circuit including third and fourth inputs configured to receive a complementary output signal in the first voltage domain and an output signal in the second voltage domain, respectively, and a second output configured to generate a pull-up gate boosting terminating signal in the second voltage domain; and a logic gate including fifth and sixth inputs configured to receive the pull-up gate boosting initiating signal and the pull-up gate terminating signal, respectively, and a third output configured to generate a pull-up gate boosting enable signal in the second voltage domain, wherein the third output is coupled to the first predriver and the second predriver.

Aspect 21: The apparatus of aspect 20, wherein the first multi-domain logic circuit includes: a third NMOS FET including a gate configured to receive the input signal; and an inverter coupled in series with the third NMOS FET between a third voltage rail and the second voltage rail, wherein the inverter includes an input configured to receive the complementary input signal, and an output configured to produce the pull-up gate boosting initiating signal.

Aspect 22: The apparatus of aspect 20 or 21, wherein the second multi-domain logic circuit includes: a third NMOS FET including a gate configured to receive the complementary output signal; and an inverter coupled in series with the third NMOS FET between a third voltage rail and the second voltage rail, wherein the inverter includes an input configured to receive the input signal, and an output configured to produce the pull-up gate boosting terminating signal.

Aspect 23: The apparatus of any one of aspects 18-22, wherein the gate boost control circuit includes a pull-down gate boost control circuit.

Aspect 24: The apparatus of aspect 23, wherein the pull-down gate boost control circuit includes: a first multi-domain logic circuit including first and second inputs configured to receive an input signal in a first voltage domain and a complementary input signal in a second voltage domain, respectively, and a first output configured to generate a pull-down gate boosting initiating signal in the first voltage domain; a second multi-domain logic circuit including third and fourth inputs configured to receive a complementary output signal in the first voltage domain and an output signal in the second voltage domain, respectively, and a second output configured to generate a pull-down gate boosting terminating signal in the first voltage domain; and a logic gate including fifth and sixth inputs configured to receive the pull-down gate boosting initiating signal and the pull-down gate terminating signal, respectively, and a third output configured to generate a pull-down gate boosting enable signal in the first voltage domain, wherein the third output is coupled to the first predriver and the second predriver.

Aspect 25: The apparatus of aspect 24, wherein the first multi-domain logic circuit includes: an inverter including an input configured to receive the input signal and an output configured to generate the pull-down gate boosting initiating signal; and a third PMOS FET coupled in series with the inverter between the first voltage rail and a third voltage rail, wherein the third PMOS FET includes a gate configured to receive the complementary input signal.

Aspect 26: The apparatus of aspect 24 or 25, wherein the second multi-domain logic circuit includes: an inverter including an input configured to receive the complementary output signal and an output configured to generate the pull-down gate boosting terminating signal; and a third PMOS FET coupled in series with the inverter between the first voltage rail and a third voltage rail, wherein the third PMOS FET includes a gate configured to receive the output signal.

Aspect 27: A method, including: applying a first control signal to a gate of a first p-channel metal oxide semiconductor field effect transistor (PMOS FET); applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a high logic state, and wherein the first and second control signals are at a first set of boosted voltages when the output signal is transitioning from the low logic state to the high logic state, respectively; applying a third control signal to a gate of a first n-channel metal oxide semiconductor field effect transistor (NMOS FET); and applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively.

Aspect 28: The method of aspect 27, further including: initiating the first and second sets of boosted voltages based on an input signal; and terminating the first and second sets of boosted voltages based on the output signal.

Aspect 29: An apparatus, including: means for applying a first control signal to a gate of a first p-channel metal oxide semiconductor field effect transistor (PMOS FET); means for applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a high logic state, and wherein the first and second control signals are at a first set of boosted voltages when the output signal is transitioning from the low logic state to the high logic state, respectively; means for applying a third control signal to a gate of a first n-channel metal oxide semiconductor field effect transistor (NMOS FET); and means for applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively.

Aspect 30: A wireless communication device, including: at least one antenna; a transceiver coupled to the at least one antenna; and an integrated circuit (IC) including one or more input/output (I/O) circuits, wherein at least one of the one or more I/O circuits includes: an output driver, including: a first p-channel metal oxide semiconductor field effect transistor (PMOS FET); a second PMOS FET coupled in series with the first PMOS FET between an upper voltage rail and an output; a first n-channel metal oxide semiconductor field effect transistor (NMOS FET); and a second NMOS FET coupled in series with the first NMOS FET between the output and a lower voltage rail; a first predriver coupled to gates of the first and second PMOS FETs and first and second NMOS FETs; and a second predriver coupled to the gates of the first and second PMOS FETs and first and second NMOS FETs.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
    an output driver, comprising:
        a first p-channel metal oxide semiconductor field effect transistor (PMOS FET);
        a second PMOS FET coupled in series with the first PMOS FET between a first voltage rail and an output;
        a first n-channel metal oxide semiconductor field effect transistor (NMOS FET); and
        a second NMOS FET coupled in series with the first NMOS FET between the output and a second voltage rail;
    a first predriver coupled to gates of the first and second PMOS FETs and to gates of the first and second NMOS FETs; and
    a second predriver coupled to the gates of the first and second PMOS FETs and to gates of the first and second NMOS FETs.

2. The apparatus of claim 1, wherein the first predriver comprises a pull-up predriver coupled to the gate of the first PMOS FET.

3. The apparatus of claim 2, wherein the pull-up predriver comprises:
    an inverter including an input configured to receive an input signal, and an output coupled to the gate of the first PMOS FET; and
    a third PMOS FET coupled in series with the inverter between the first voltage rail and a third voltage rail, wherein the third PMOS FET is configured to receive a pull-up gate boosting enable signal.

4. The apparatus of claim 1, wherein the second predriver comprises a pull-up predriver coupled to the gate of the first PMOS FET.

5. The apparatus of claim 4, wherein the pull-up predriver comprises:
    a third NMOS FET coupled between the first voltage rail and the gate of the first PMOS FET, wherein the third NMOS FET includes a gate configured to receive a first bias voltage;
    a diode-connected NMOS FET;
    a fourth NMOS FET including a gate configured to receive a second bias voltage; and
    a fifth NMOS FET coupled in series with the diode-connected NMOS FET and the fourth NMOS FET between the gate of the first PMOS FET and the second voltage rail, wherein the fifth NMOS FET includes a gate configured to receive a pull-up gate boosting enable signal.

6. The apparatus of claim 1, wherein the first predriver comprises a pull-up predriver coupled to the gate of the second PMOS FET.

7. The apparatus of claim 6, wherein the pull-up predriver comprises a third PMOS FET including a source configured to receive a bias voltage, a gate configured to receive a pull-up gate boosting enable signal, and a drain coupled to the gate of the second PMOS FET.

8. The apparatus of claim 1, wherein the second predriver comprises a pull-up predriver coupled to the gate of the second PMOS FET.

9. The apparatus of claim 8, wherein the pull-up predriver comprises:
    a third NMOS FET coupled between the first voltage rail and the gate of the second PMOS FET, wherein the third NMOS FET includes a gate configured to receive a bias voltage;
    a diode-connected NMOS FET; and
    a fourth NMOS FET coupled in series with the diode-connected NMOS FET between the gate of the second PMOS FET and the second voltage rail, wherein the fourth NMOS FET includes a gate configured to receive a pull-up gate boosting enable signal.

10. The apparatus of claim 1, wherein the first predriver comprises a pull-down predriver coupled to the gate of the second NMOS FET.

11. The apparatus of claim 10, wherein the pull-down predriver comprises:
    a third NMOS FET including a gate configured to receive a pull-down gate boosting enable signal; and
    an inverter coupled in series with the third NMOS FET between a third voltage rail and the second voltage rail, wherein the inverter includes an input configured to receive an input signal, and an output coupled to the gate of the second NMOS FET.

12. The apparatus of claim 1, wherein the second predriver comprises a pull-down predriver coupled to the gate of the second NMOS FET.

13. The apparatus of claim 12, wherein the pull-down predriver comprises:
    a third PMOS FET including a gate configured to receive a pull-down gate boosting enable signal;

33 a fourth PMOS FET including a gate configured to receive a first bias voltage;
a diode-connected PMOS FET coupled in series between the first voltage rail and the gate of the second NMOS FET; and
a fourth PMOS FET including a gate configured to receive a second bias voltage.

14. The apparatus of claim 1, wherein the first predriver comprises a pull-down predriver coupled to the gate of the first NMOS FET.

15. The apparatus of claim 14, wherein the pull-down predriver comprises a third NMOS FET including a drain configured to receive a bias voltage, a gate configured to receive a pull-down gate boosting enable signal, and a drain coupled to the gate of the first NMOS FET.

16. The apparatus of claim 1, wherein the second predriver comprises a pull-down predriver coupled to the gate of the first NMOS FET.

17. The apparatus of claim 16, wherein the pull-down predriver comprises:
a third PMOS FET including a gate configured to receive a pull-down gate boosting enable signal;
a diode-connected PMOS FET coupled in series with the third PMOS FET between the first voltage rail and the gate of the first NMOS FET; and
a fourth PMOS FET coupled between the gate of the first NMOS FET and the second voltage rail, wherein the fourth PMOS FET includes a gate configured to receive a bias voltage.

18. The apparatus of claim 1, further comprising a gate boost control circuit coupled to the first predriver and the second predriver.

19. The apparatus of claim 18, wherein the gate boost control circuit comprises a pull-up gate boost control circuit.

20. The apparatus of claim 19, wherein the pull-up gate boost control circuit comprises:
a first multi-domain logic circuit including first and second inputs configured to receive an input signal in a first voltage domain and a complementary input signal in a second voltage domain, respectively, and a first output configured to generate a pull-up gate boosting initiating signal in the second voltage domain;
a second multi-domain logic circuit including third and fourth inputs configured to receive a complementary output signal in the first voltage domain and an output signal in the second voltage domain, respectively, and a second output configured to generate a pull-up gate boosting terminating signal in the second voltage domain; and
a logic gate including fifth and sixth inputs configured to receive the pull-up gate boosting initiating signal and the pull-up gate terminating signal, respectively, and a third output configured to generate a pull-up gate boosting enable signal in the second voltage domain, wherein the third output is coupled to the first predriver and the second predriver.

21. The apparatus of claim 20, wherein the first multi-domain logic circuit comprises:
a third NMOS FET including a gate configured to receive the input signal; and
an inverter coupled in series with the third NMOS FET between a third voltage rail and the second voltage rail, wherein the inverter includes an input configured to receive the complementary input signal, and an output configured to produce the pull-up gate boosting initiating signal.

34

22. The apparatus of claim 20, wherein the second multi-domain logic circuit comprises:
a third NMOS FET including a gate configured to receive the complementary output signal; and
an inverter coupled in series with the third NMOS FET between a third voltage rail and the second voltage rail, wherein the inverter includes an input configured to receive the input signal, and an output configured to produce the pull-up gate boosting terminating signal.

23. The apparatus of claim 18, wherein the gate boost control circuit comprises a pull-down gate boost control circuit.

24. The apparatus of claim 23, wherein the pull-down gate boost control circuit comprises:
a first multi-domain logic circuit including first and second inputs configured to receive an input signal in a first voltage domain and a complementary input signal in a second voltage domain, respectively, and a first output configured to generate a pull-down gate boosting initiating signal in the first voltage domain;
a second multi-domain logic circuit including third and fourth inputs configured to receive a complementary output signal in the first voltage domain and an output signal in the second voltage domain, respectively, and a second output configured to generate a pull-down gate boosting terminating signal in the first voltage domain; and
a logic gate including fifth and sixth inputs configured to receive the pull-down gate boosting initiating signal and the pull-down gate terminating signal, respectively, and a third output configured to generate a pull-down gate boosting enable signal in the first voltage domain, wherein the third output is coupled to the first predriver and the second predriver.

25. The apparatus of claim 24, wherein the first multi-domain logic circuit comprises:
an inverter including an input configured to receive the input signal and an output configured to generate the pull-down gate boosting initiating signal; and
a third PMOS FET coupled in series with the inverter between the first voltage rail and a third voltage rail, wherein the third PMOS FET includes a gate configured to receive the complementary input signal.

26. The apparatus of claim 24, wherein the second multi-domain logic circuit comprises:
an inverter including an input configured to receive the complementary output signal and an output configured to generate the pull-down gate boosting terminating signal; and
a third PMOS FET coupled in series with the inverter between the first voltage rail and a third voltage rail, wherein the third PMOS FET includes a gate configured to receive the output signal.

27. A method, comprising:
applying a first control signal to a gate of a first p-channel metal oxide semiconductor field effect transistor (PMOS FET);
applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a high logic state, and wherein the first and second control signals are at a first set of boosted voltages when the output signal is transitioning from the low logic state to the high logic state, respectively;

applying a third control signal to a gate of a first n-channel metal oxide semiconductor field effect transistor (NMOS FET); and applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively.

28. The method of claim 27, further comprising:

initiating the first and second sets of boosted voltages based on an input signal; and terminating the first and second sets of boosted voltages based on the output signal.

29. An apparatus, comprising:

means for applying a first control signal to a gate of a first p-channel metal oxide semiconductor field effect transistor (PMOS FET);

means for applying a second control signal to a gate of a second PMOS FET coupled in series with the first PMOS FET between a first voltage rail and an output, wherein the first and second control signals are at high logic voltages when an output signal at the output is at a low logic state, wherein the first and second control signals are at low logic voltages when the output signal is at a high logic state, and wherein the first and second control signals are at a first set of boosted voltages when the output signal is transitioning from the low logic state to the high logic state, respectively;

means for applying a third control signal to a gate of a first n-channel metal oxide semiconductor field effect transistor (NMOS FET); and means for applying a fourth control signal to a gate of a second NMOS FET coupled in series with the first NMOS FET between the output and a second voltage rail, wherein the third and fourth control signals are at low logic voltages when the output signal is at the high logic state, wherein the third and fourth control signals are at high logic voltages when the output signal is at the low logic state, and wherein the third and fourth control signals are at a second set of boosted voltages when the output signal is transitioning from the high logic state to the low logic state, respectively.

30. A wireless communication device, comprising:

at least one antenna;

a transceiver coupled to the at least one antenna; and an integrated circuit (IC) coupled to the transceiver, wherein the IC includes one or more input/output (I/O) circuits, comprising:

an output driver, comprising:

a first p-channel metal oxide semiconductor field effect transistor (PMOS FET);

a second PMOS FET coupled in series with the first PMOS FET between an upper voltage rail and an output;

a first n-channel metal oxide semiconductor field effect transistor (NMOS FET); and a second NMOS FET coupled in series with the first NMOS FET between the output and a lower voltage rail;

a first predriver coupled to gates of the first and second PMOS FETs and to gates of the first and second NMOS FETs; and a second predriver coupled to the gates of the first and second PMOS FETs and to gates of the first and second NMOS FETs.

\* \* \* \* \*